United States Patent
Chung et al.

(10) Patent No.: US 11,791,409 B2
(45) Date of Patent: Oct. 17, 2023

(54) HIGH VOLTAGE SEMICONDUCTOR DEVICE AND MANUFACTURING METHOD OF HIGH VOLTAGE SEMICONDUCTOR DEVICE

(71) Applicant: Key Foundry Co., Ltd., Cheongju-si (KR)

(72) Inventors: Jin Seong Chung, Cheongju-si (KR); Tae Hoon Lee, Sejong-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 0 days.

(21) Appl. No.: 18/093,445

(22) Filed: Jan. 5, 2023

(65) Prior Publication Data

US 2023/0145810 A1    May 11, 2023

Related U.S. Application Data

(62) Division of application No. 17/400,272, filed on Aug. 12, 2021, now Pat. No. 11,581,434, which is a
(Continued)

(30) Foreign Application Priority Data

Oct. 2, 2019    (KR) .................. 10-2019-0122304

(51) Int. Cl.
*H01L 29/78*    (2006.01)
*H01L 29/06*    (2006.01)
(Continued)

(52) U.S. Cl.
CPC ........ *H01L 29/7835* (2013.01); *H01L 29/063* (2013.01); *H01L 29/0623* (2013.01);
(Continued)

(58) Field of Classification Search
CPC ............. H01L 29/7835; H01L 29/0623; H01L 29/063; H01L 29/0886; H01L 29/66659;
(Continued)

(56) References Cited

U.S. PATENT DOCUMENTS

| 7,602,037 B2 | 10/2009 | Lin et al. |
| 7,964,915 B2 | 6/2011 | Tanaka et al. |

(Continued)

FOREIGN PATENT DOCUMENTS

| KR | 10-0813391 B1 | 3/2008 |
| KR | 10-2015-0105498 A | 9/2015 |
| KR | 10-2016-0077541 A | 7/2016 |

OTHER PUBLICATIONS

Korean Office Action dated Sep. 22, 2020 in counterpart Korean Patent Application No. 10-2019-0122304 (7 pages in Korean).

*Primary Examiner* — Shahed Ahmed
(74) *Attorney, Agent, or Firm* — NSIP Law

(57) ABSTRACT

A semiconductor device includes a deep well region located on a substrate, a drift region located in the deep well region, a first gate electrode that overlaps with the first body region and the drift region, a second gate electrode that overlaps with the second body region and the drift region, a first source region and a second source region located in the first and second body regions, respectively, a drain region located in the drift region and disposed between the first gate electrode and the second gate electrode, a silicide layer located on the substrate, a first non-silicide layer located between the drain region and the first gate electrode, wherein the first non-silicide layer extends over a top surface of the first gate electrode, and a first field plate contact plug in contact with the first non-silicide layer.

17 Claims, 19 Drawing Sheets

Related U.S. Application Data division of application No. 16/808,569, filed on Mar. 4, 2020, now Pat. No. 11,121,253.

(51) Int. Cl.
  *H01L 29/08* (2006.01)
  *H01L 29/40* (2006.01)
  *H01L 29/66* (2006.01)

(52) U.S. Cl.
  CPC ...... *H01L 29/0856* (2013.01); *H01L 29/0886* (2013.01); *H01L 29/402* (2013.01); *H01L 29/66659* (2013.01); *H01L 29/66689* (2013.01); *H01L 29/7816* (2013.01)

(58) Field of Classification Search
  CPC ........... H01L 29/66689; H01L 29/6659; H01L 29/7833; H01L 21/823493; H01L 21/823418; H01L 21/324; H01L 21/265; H01L 29/402–407; H01L 29/66681–66704; H01L 29/7816–7826; H01L 29/66674–66734; H01L 29/7801–7826; H01L 29/0856–0869; H01L 21/76889; H01L 29/665–66507
  See application file for complete search history.

(56) References Cited

U.S. PATENT DOCUMENTS

| | | | |
|---|---|---|---|
| 9,691,893 B2 | 6/2017 | Hebert et al. | |
| 9,698,258 B2 | 7/2017 | Ryu et al. | |
| 9,871,132 B1* | 1/2018 | Liu | H01L 29/7835 |
| 10,468,522 B2 | 11/2019 | Ryu et al. | |
| 10,586,863 B2 | 3/2020 | Hebert et al. | |
| 2012/0175673 A1* | 7/2012 | Lee | H01L 29/7816 |
| | | | 257/140 |
| 2013/0093010 A1* | 4/2013 | Huang | H01L 29/7816 |
| | | | 257/E29.256 |
| 2013/0277741 A1* | 10/2013 | Guowei | H01L 29/7835 |
| | | | 257/E29.256 |
| 2015/0084126 A1 | 3/2015 | Jung et al. | |
| 2016/0099349 A1* | 4/2016 | Parris | H01L 29/0623 |
| | | | 438/286 |
| 2019/0181227 A1 | 6/2019 | Lee | |
| 2019/0288063 A1* | 9/2019 | Komatsu | H01L 29/0696 |
| 2019/0288112 A1* | 9/2019 | Wang | H01L 29/517 |
| 2019/0386117 A1* | 12/2019 | Lee | H01L 29/0634 |
| 2020/0043801 A1* | 2/2020 | Kim | H01L 29/0878 |
| 2020/0373395 A1* | 11/2020 | Ho | H01L 29/4966 |

\* cited by examiner

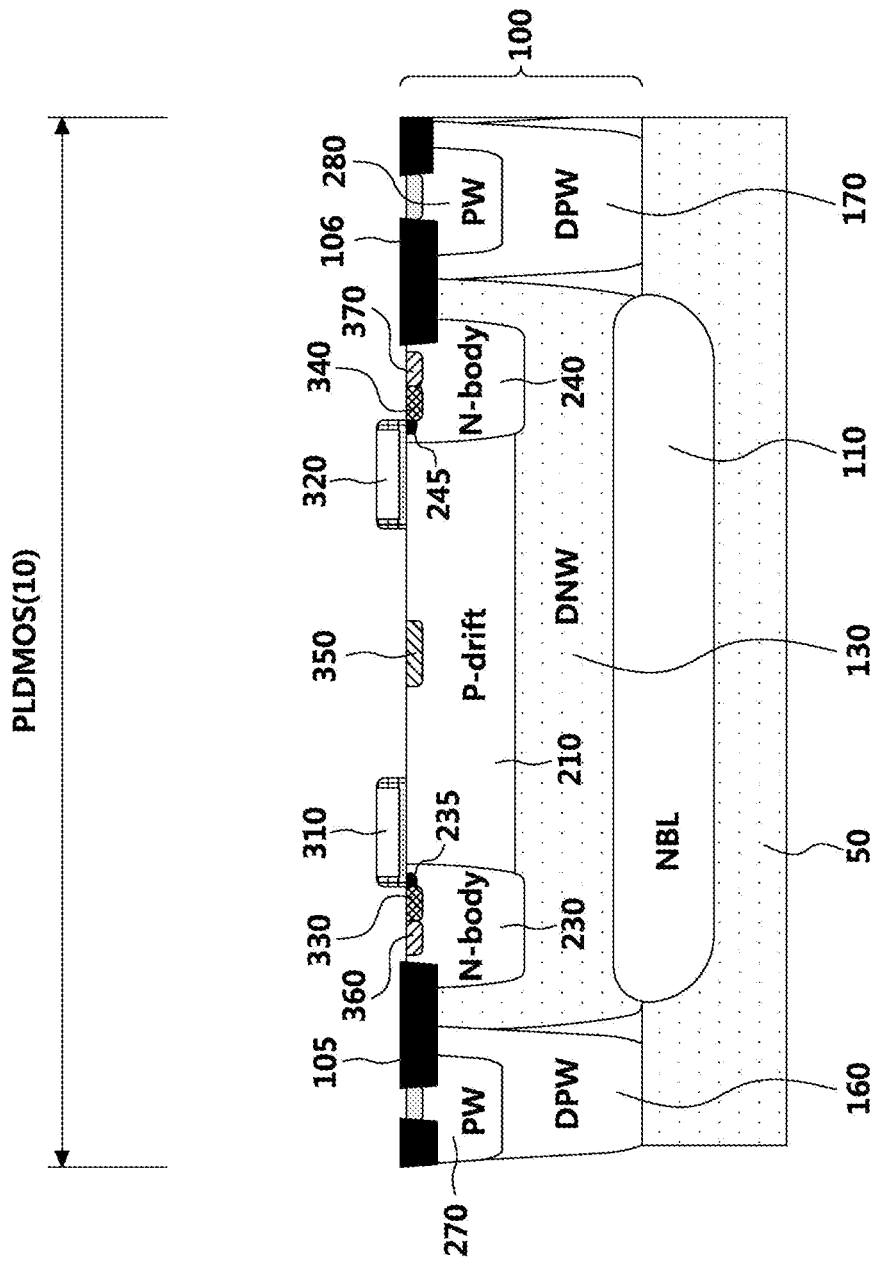

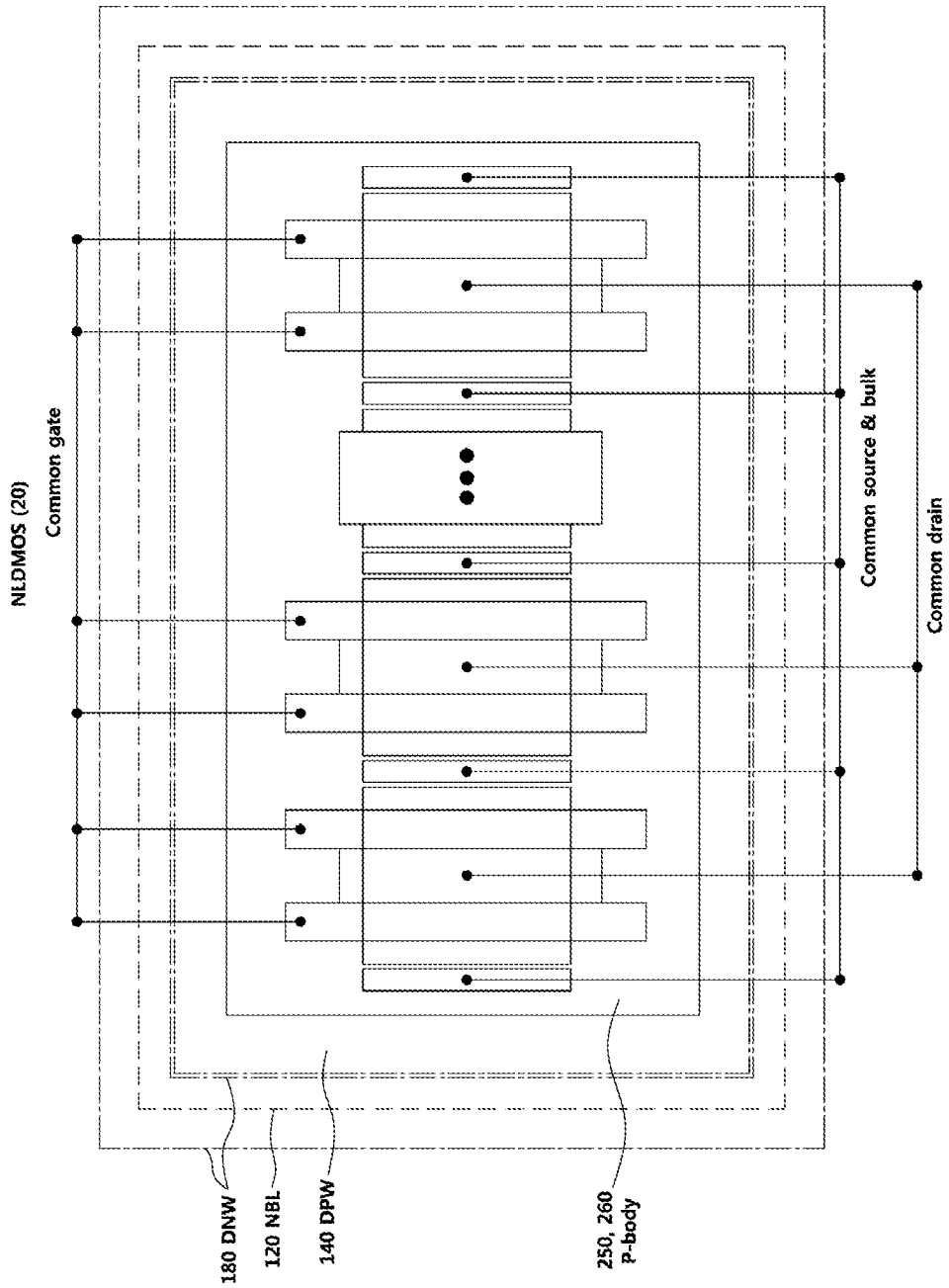

HIGH VOLTAGE SEMICONDUCTOR DEVICE AND MANUFACTURING METHOD OF HIGH VOLTAGE SEMICONDUCTOR DEVICE

CROSS-REFERENCE TO RELATED APPLICATIONS

This is a divisional application of U.S. application Ser. No. 17/400,272, filed on Aug. 12, 2021, which is a divisional application of U.S. application Ser. No. 16/808,569, filed on Mar. 4, 2020, which claims the benefit under 35 U.S.C. 119(a) of Korean Patent Application No. 10-2019-0122304 filed on Oct. 2, 2019, in the Korean Intellectual Property Office, the entire disclosure of which is incorporated herein by reference for all purposes.

BACKGROUND

1. Field

The following description relates to a high voltage semiconductor device and a manufacturing method of such a high voltage semiconductor device.

2. Description of Related Art

P-type and N-type lateral double-diffused MOS (PLDMOS and NLDMOS) devices are generally used as high-voltage MOS devices. Owing to the higher input impedance in comparison to a bipolar transistor, LDMOS transistors may realize a high power gain and/or a simpler gate driving circuit. Because an LDMOS transistor is a unipolar device, the LDMOS transistor may advantageously exhibit little or no time delay when being turned off. The time delay may usually originate from accumulated hydrophobic carriers.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a deep well region located on a substrate, a drift region located in the deep well region, wherein there is a P-N junction located between the drift region and the deep well region, a first body region and a second body region located in the drift region, wherein each of the first body region and the second body region has a depth deeper than a depth of the drift region, a first gate electrode that overlaps with the first body region and the drift region, a second gate electrode hat overlaps with the second body region and the drift region, a first source region and a second source region located in the first and second body regions, respectively, a drain region located in the drift region and disposed between the first gate electrode and the second gate electrode, a silicide layer located on the substrate, a first non-silicide layer located between the drain region and the first gate electrode, wherein the first non-silicide layer extends over a top surface of the first gate electrode, and a first field plate contact plug in contact with the first non-silicide layer.

The semiconductor device may further include a first source contact plug in contact with the first source region, a drain contact plug in contact with the drain region, and a first gate contact plug in contact with the first gate electrode, wherein the first field plate contact plug is electrically connected with either one or both of the first gate contact plug and the first source contact plug.

The semiconductor device may further include a first body contact region located in the first body region and located adjacent to the first source region, a second body contact region located in the second body region and located adjacent to the second source region, a second source contact plug in contact with the second source region, a second gate contact plug in contact with the second gate electrode, a first body contact plug in contact with the first body contact region, a second body contact plug in contact with the second body contact region, a second non-silicide layer located between the drain region and the second gate electrode, wherein the second non-silicide layer extends over a top surface of the second gate electrode, and a second field plate contact plug in contact with the second non-silicide layer.

The first non-silicide layer may include a first insulating layer, and a second insulating layer, wherein the second insulating layer may have a different etch selectivity from an etch selectivity of the first insulating layer.

The semiconductor device may further include a first buried layer located on the substrate, and a second buried layer located between the drift region and the first buried layer, wherein the second buried layer may be in direct contact with the drift region and the second buried layer may have a length smaller than a length of the first buried layer.

The semiconductor device of may further include a borderless contact etch stopping layer located on the first non-silicide layer and the silicide layer, an interlayer insulating layer located on the borderless contact etch stopping layer, and a metal layer located on the interlayer insulating layer.

The semiconductor device may further include a ring-type body region that is formed by connecting the first body region to the second body region.

In another general aspect, a semiconductor device includes a deep well region located on a substrate, a drift region that overlaps with the deep well region, wherein there is a P-N junction located between the drift region and the deep well region, a ring-type body region located in the drift region, wherein a first end of the ring-type body region extends outside the drift region, a first gate electrode and a second gate electrode located on the drift region and on the ring-type body region, wherein a second end of the ring-type body region overlaps with the first gate electrode and the second gate electrode, a first source region and a second source region located in the ring-type body region, a drain region located in the drift region and disposed between the first gate electrode and the second gate electrode, a silicide layer located on the substrate, a first non-silicide layer located on the drift region and overlapping with the first gate electrode, and a first field plate contact plug located in contact with the first non-silicide layer.

The semiconductor device may further include a first source contact plug in contact with the first source region, a drain contact plug in contact with the drain region, and a first gate contact plug located on the first gate electrode, wherein the first plate contact plug may be electrically connected with either one or both of the first gate contact plug and the first source contact plug.

The semiconductor device may further include a first body contact region located in the ring-type body region and located adjacent to the first source region, a second body contact region located in the ring-type body region and located adjacent to the second source region, a second source contact plug in contact with the second source region, a second gate contact plug in contact with the second gate electrode, a first body contact plug in contact with the first body contact region, a second body contact plug in contact with the second body contact region, a second non-silicide layer located between the drain region and the second gate electrode, wherein the second non-silicide layer extends over a top surface of the second gate electrode, and a second field plate contact plug in contact with the second non-silicide layer.

The first non-silicide layer may be spaced apart from the ring-type body region, the first gate contact plug, and the drain contact plug, and the second non-silicide layer may be spaced apart from the ring-type body region, the second gate contact plug, and the drain contact plug.

The first field plate may have a length smaller than a length of the first gate electrode in a same direction.

The semiconductor device may have a symmetric structure with respect to the drain contact plug.

The ring-type body region may have a depth deeper than a depth of the drift region and may include a first body region and a second body region.

In another general aspect, a method of manufacturing a semiconductor device may include forming a first conductivity type deep well region on a substrate, forming a guard ring that encloses the first conductivity type deep well region, forming a second conductivity type drift region in the first conductivity type deep well region, forming a first conductivity type body region in the second conductivity type drift region, wherein the first conductivity type body region has a depth deeper than a depth of the second conductivity type drift region, forming gate electrodes that overlap the second conductivity type drift region and the first conductivity type body region, forming second conductivity type source regions in the first conductivity type body region, forming a second conductivity type drain region in the second conductivity type drift region, disposed between the gate electrodes, and forming non-silicide layers between the second conductivity type drain region and the gate electrodes, wherein the non-silicide layers extend to each top surface of the gate electrodes, forming silicide layers on the second conductivity type source regions, the second conductivity type drain regions, and the gate electrodes, forming source contact plugs in contact with the second conductivity type source regions, and forming field plate plugs over the non-silicide layers and disposed between the second conductivity type drain region and the gate electrodes.

The method may further include forming a first buried layer in the substrate, forming a second buried layer on the first buried layer and having an opposite conductivity type to a conductivity type of the first buried layer, wherein the second buried layer is in direct contact with the second conductivity type drift region and the first conductivity type body region.

The method may further include forming a borderless contact etch stopping layer on the non-silicide layers and the silicide layers, forming an interlayer insulating layer on the borderless contact etch stopping layer, and forming metal patterns on the interlayer insulating layer.

The first conductivity type body region may have a ring-type shape in a top view, wherein a first end of the first conductivity type body region may extend outside the drift region, and wherein a second end of the first conductivity type body region may overlap with the gate electrodes.

In another general aspect, a semiconductor device includes a deep well region located on a substrate, a drift region located in the deep well region, a first body region and a second body region located in the drift region, a first gate electrode that overlaps with the first body region and the drift region, a second gate electrode that overlaps with the second body region and the drift region, a first source region and a second source region located in the first and second body regions, respectively, a drain region located in the drift region and disposed between the first gate electrode and the second gate electrode, a silicide layer located on the substrate, a first non-silicide layer located between the drain region and the first gate electrode; and a first field plate contact plug in contact with the first non-silicide layer.

There may be a P-N junction located between the drift region and the deep well region.

Each of the first body region and the second body region may have a depth deeper than a depth of the drift region.

The first non-silicide layer may extend over a top surface of the first gate electrode.

Other features and aspects will be apparent from the following detailed description, the drawings, and the claims.

BRIEF DESCRIPTION OF THE DRAWINGS

FIG. 1A is a cross-sectional view illustrating a PLDMOS semiconductor device of a second conductivity type according to an example.

FIG. 2C is a top view illustrating an NLDMOS array structure according to an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1B:
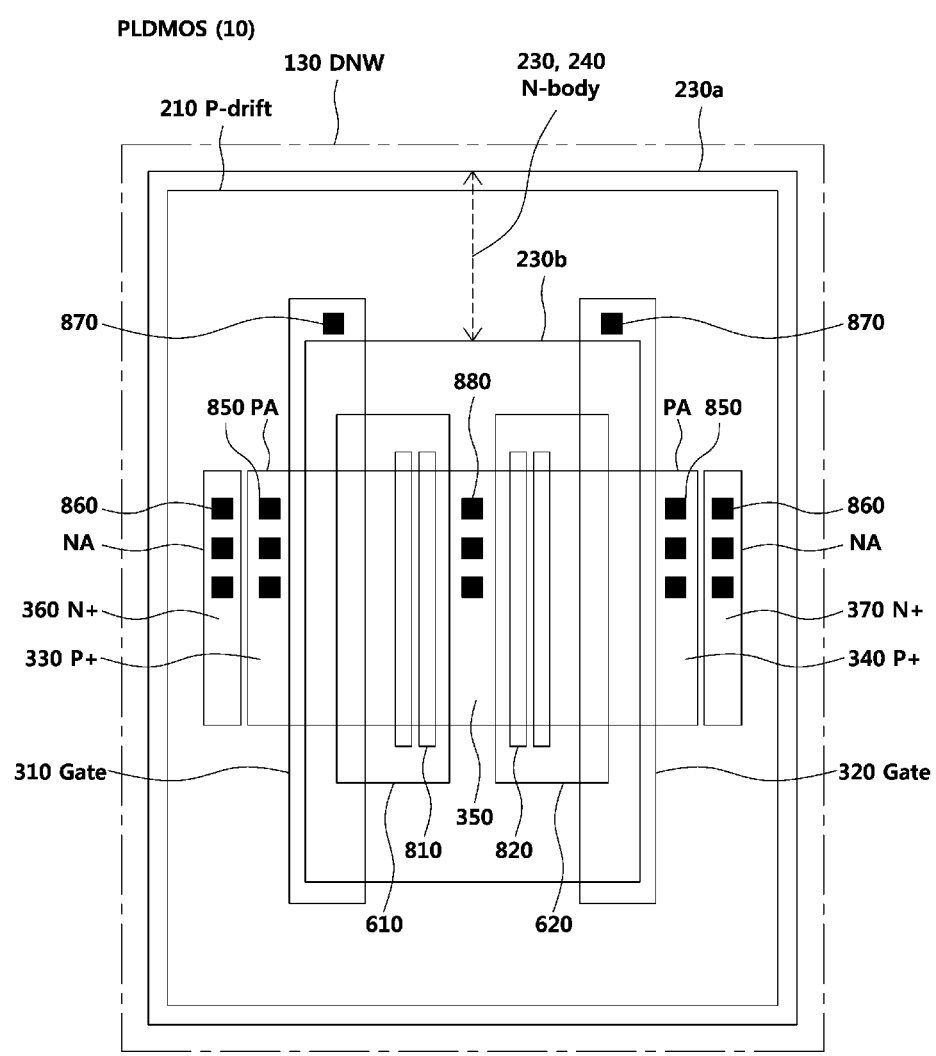
FIG. 1B is a top view illustrating a PLDMOS semiconductor device of a second conductivity type according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The following description relates to a high voltage semiconductor device comprising a PLDMOS and a NLDMOS in one single chip while reducing the number of masks required for the manufacturing process.

The integration of high voltage devices including PLDMOS and NLDMOS devices in a single chip may be very challenging, because many fabrication steps are involved. Furthermore, sustaining fixed channel length may be difficult due to many thermal steps, such as high temperature drive-in annealing process, being involved in the integration of high voltage devices.

In the typical high voltage devices, a tilted angle implantation may be used to form the body regions and the LDD regions under the gate electrode. In such an example, the tilted angle may be increased up to about 60° because the body region and the LDD region are formed after formation of the gate electrode. In such an example, there may be a limitation to adjusting the desired channel length in the high voltage devices. In addition, because of the excessive tilt angle, the implanted dopants may not be uniformly distributed in the active region of the substrate.

The following description relates to a structure of a lateral double-diffused metal oxide semiconductor (LDMOS) technique applied to a device for high voltage or power. LDMOS technology may provide a multi-carrier device that is a typical horizontal power device, which may have a fast switching response, a high input impedance, a relatively high breakdown voltage, and a relatively low on-resistance (Ron). The examples are described in further detail for each structure of an N-type or P-type LDMOS device, and also for an example in which the two devices are configured together. In an example, an N type may be referred to as a first conductivity type, and a P type may be referred to as a second conductivity type. Alternatively, a P type may be referred to as a first conductivity type and N type may be referred to as a second conductivity type.

A high voltage semiconductor device and a manufacturing method of such a high voltage semiconductor device according to an example is described in further detail. A semiconductor device according to an example is described in further detail with reference to a semiconductor device in which a PLDMOS and an NLDMOS may be implemented together.

Accordingly, the following description may provide a high voltage semiconductor device and a manufacturing method of such a high voltage semiconductor device that uses the inherent diffusion characteristics of a dopant when forming a body region and an LDD region during a semiconductor device manufacturing process to ensure a stable channel length by applying a drive-in process. In such an example, the processing order may be changed so that a dopant may be easily implanted into a desired region using a smaller tilt angle than a tilt angle used in a typical method.

The following description also provides a method of manufacturing a semiconductor device at a low cost by reducing the number of masks used in a semiconductor device by forming a body region and an LDD region by using the same mask pattern, before a gate process.

The following description provides a method for manufacturing a semiconductor device including forming a buried layer of a first conductivity type in a semiconductor substrate, forming a deep well region of a first conductivity type on the buried layer of the first conductivity type, forming a first isolation region on the first conductivity type deep well region, forming a drift region of a second conductivity type in the deep well region of the first conductivity type, forming first and second body regions of a first conductivity type in the drift region of the second conductivity type, forming first and second LDD regions of a second conductivity type in the first and second body regions of the first conductivity type, respectively, forming first and second gate electrodes on the drift region of the second conductivity type, forming first and second source regions of a second conductivity type in the first and second body regions of the first conductivity type, respectively, forming a common drain region of a second conductivity type in the drift region of the second conductivity type, and forming a silicide on the substrate.

The following description further includes forming a first channel between the first LDD region of the second conductivity type and the drift region of the second conductivity type by performing a drive-in process, and forming a second channel between the second LDD region of the second conductivity type and the drift region of the second conductivity type by performing the drive-in process.

In an example, the first and second body regions of the first conductivity type may be formed by being ion implanted into the substrate at a tilt angle of 0 to 20 degrees with respect to the vertical direction.

In an example, the first and second body regions of the first conductivity type may be formed deeper than the drift region of the second conductivity type.

In an example, the first and second body regions of the first conductivity type and the first P-type and second LDD regions may be formed by the same mask pattern.

In an example, forming a plurality of isolation regions of a second conductivity type to be in contact with the deep well region of the first conductivity type may be further included.

In an example, the first channel region may be formed by a difference of diffusion coefficients of a dopant between that of the first body region of the first conductivity type and that of the first LDD region of the second conductivity type.

In an example, forming a first insulating film between the gate electrode and the drain region, forming a second insulating film on the first insulating film, and forming a field plate plugs between the gate electrode and the drain region may be further included.

In an example, the first body region of the first conductivity type may be formed to overlap a portion of the drift region of the second conductivity type, and the second body region of the first conductivity type may be formed to overlap another portion of the drift region of the second conductivity type.

In another general aspect, there is provided a method for manufacturing a semiconductor device including forming a buried layer of a first conductivity type in a semiconductor substrate, forming a deep well region of a second conductivity type on the buried layer, forming a buried layer of a second conductivity type in the deep well region of the second conductivity type, forming a drift region of a first conductivity type on the buried layer of the second conductivity type, forming first and second body regions of a second conductivity type in a portion of the drift region of the first conductivity type, forming first and second LDD regions of a first conductivity type in the first and second body regions of the second conductivity type, respectively, forming first and second gate electrodes on the drift region of the first conductivity type, forming first and second source regions in the first and second body regions of the second conductivity type, respectively, and forming a common drain region in the drift region of the first conductivity type.

In an example, the first body region of the second conductivity type may be formed to overlap a portion of the drift region of the first conductivity type, and the first and second body regions of the second conductivity type are formed to overlap with another portion of the drift region of the first conductivity type.

In an example, the buried layer of the first conductivity type may be formed to be longer than the buried layer of the second conductivity type.

In an example, the method may further include forming a plurality of isolation regions of the first conductivity type to be in contact with the buried layer of the first conductivity type.

In another general aspect, there is provided a method for manufacturing a semiconductor device including forming first and second buried layers of a first conductivity type spaced apart from each other on a semiconductor substrate, forming a deep well region of a first conductivity type on the first buried layer of the first conductivity type, forming a deep well region of a second conductivity type on the second buried layer of the first conductivity type, forming a buried layer of a second conductivity type on the second buried layer of the first conductivity type, forming a P-type drift region in the deep well region of the first conductivity type, forming a drift region of a first conductivity type in the deep well region of the second conductivity type, forming a body region of a first conductivity type by performing ion implantation to overlap the drift region of the second conductivity type, forming a body region of a second conductivity type by performing ion implantation to overlap the drift region of the first conductivity type, forming first and second gate electrodes on the drift region of the first and second conductivity types, respectively, forming a source region of a second conductivity type in the body region of the first conductivity type, forming a drain region of a second conductivity type in the drift region of the second conductivity type, forming a source region of a first conductivity type in the body region of the second conductivity type, forming a drain region of a first conductivity type in the drift region of the first conductivity type, and forming a silicide on the substrate.

In an example, the method may further include forming an LDD region of a second conductivity type in the body region of the first conductivity type, and forming an LDD region of a first conductivity type in the body region of the second conductivity type.

In an example, the body region of the first conductivity type and the LDD region of the second conductivity type may be formed by the same first mask pattern.

In an example, the body region of the second conductivity type and the LDD region of the first conductivity type may be formed by the same second mask pattern.

In another aspect, the following description may provide for a high voltage semiconductor device manufactured through such a manufacturing method.

According to the example of FIG. 1A, a cross-sectional view of a PLDMOS semiconductor device is illustrated.

According to the example of FIG. 1A, the PLDMOS semiconductor device 10 may be provided with a semiconductor substrate 50. In such an example, the first conductivity type may be N-type, and the second conductivity type may be P-type. The semiconductor substrate may include a silicon substrate 50 of the first or a second conductivity type. In addition, a first conductivity type (N-type) buried layer (NBL) 110 of heavily doped region may be formed in the silicon substrate 50. The NBL 110 may have an opposite conductivity type to that of the silicon substrate 50. The NBL 110 may isolate the well region 130 that is formed above the NBL 110 from the substrate 50.

According to the example of FIG. 1A, furthermore, a second conductivity type epitaxial layer (P-epi) 100 may be formed on the NBL 110. The first conductivity type deep well region (DNW) 130 may be formed in the P-epi 100. The DNW region 130 may have a higher doping concentration than a doping concentration of the P-epi 100. A second conductivity type drift (P-drift) region 210 may be formed in the DNW region 130. A first conductivity type first body (first N-body) region 230 and a first conductivity type second body (second N-body) region 240 may be formed to enclose the P-drift region 210. Such a first N-body region 230 and a second N-body region 240 may be merged together to form a single ring-type N-body region in a top view, as shown in the example of FIG. 1B.

According to the example of FIG. 1A, a second conductivity type first source (first P+ source) region 330 and a second conductivity type second source (second P+ source) region 340 may be formed in the first N-body 230 and the second N-body region 240, respectively. A second conductivity type common drain (P+ drain) region 350 may be formed in the P-drift region 210. A first conductivity type first body contact (N+ body contact) region 360 and a first conductivity type second body contact (N+ body contact) region 370 may be formed in the first N-body region 230 and the second N-body region 240, respectively. Also, the first N+ body contact region 360 and the second N+ body contact region 370 may be in contact with the first P+ source region 330 and the second P+ source region 340, respectively.

According to the example of FIG. 1A, the first N-body region 230 and the second N-body region 240 may overlap with the P-drift region 210. Therefore, each of the two N-body regions 230 and 240 may have an overlapping region with the P-drift region 210. Such an overlapping region may be a counter-doping region. In the first N-body region 230 or the second N-body region 240, a net doping concentration of the N-type dopants may be higher than a net doping concentration of the P-type dopants. However, due to the presence of the overlapping region, the first N-body region 230 and the second N-body region 240 may have a doping concentration lower than the original doping concentration. This phenomenon may occur because the dopants having the first conductivity type may be implanted into the P-drift region 210 having the second conductivity type.

According to the example of FIG. 1A, the overlapping region may start from under the gate electrode and may extend to a portion of the substrate located below an isolation region or insulating films 105 and 106. Alternatively put, the overlapping region may be formed from underneath the gate electrode and may overlap with the isolation region or insulated isolation region, or may extend to underneath a bottom surface of the isolation regions 105 and 106. In such an example, there may also be a non-overlapping region between the first or second body region of the first conductivity type and the P-drift region 210. The non-overlapping region may have a relatively higher concentration than that of the overlapping region. In addition, the first N-body region 230 and the second N-body region 240 may be formed to be deeper than the P-drift region 210.

According to the example of FIG. 1A, in the present example, the first and second N-body regions 230 and 240 may be formed by implanting dopants at a predetermined tilt angle. Such a tilt angle may vary depending on the conductivity type of dopant being implanted. In the example of the first N-body region 230 and the second N-body region 240 in FIGS. 1A-1C, the first conductivity type dopant may be ion implanted at a tilt angle of 0 to 20 degrees. Such a tilt angle is determined by an optimization process. As described in greater detail above, an excessive tilt angle causes a dispersion problem and a long channel length. However, in the present example, by selecting an optimal tilt angle, the channel length may be reduced to the greatest extent possible, and the ON resistance may be lowered accordingly, because the channel length is reduced. If dopants are implanted without such a tilt angle when forming the first and second body regions 230 and 240, dopant dispersion may be reduced but a channel may not be formed, because the gate electrode formed later may not overlap with the first N-body region 230 and the second N-body region 240. In this example, it may be difficult to form a channel region. Therefore, an appropriate tilt angle may be used when forming the first N-body region 230 and the second N-body region 240.

According to the example of FIG. 1A, subsequently, first and second gate electrodes 310 and 320 may be formed on the silicon substrate 50 by being insulated by a gate insulating layer, and a spacer may be formed on the sidewalls of the first and second gate electrodes 310 and 320. The first and second gate electrodes 310 and 320 may be formed over the first N-body region 230 and the second N-body region 240 and the P-drift region 210, and may be disposed between the P+ source regions 330 and 340 of the second conductivity type and the common P+ drain region 350 of the second conductivity type. Additionally, the first and second gate electrodes 310 and 320 may have the same conductivity type as the P+ source regions 330 and 340 of the second conductivity type.

According to the example of FIG. 1A, insulated isolation regions 105 and 106 may be formed next to the first and second N+ body contact regions 360 and 370 of the first conductivity type or the first N-body region 230 and the second N-body region 240 for isolating these regions from adjacent devices. For example, the insulated isolation regions 105 and 106 may be formed by using trench or local oxidation of silicon (LOCOS) structures. Trench isolation regions having a different depth may also be formed in the high voltage device or power semiconductor device. In such an example, the insulated isolation regions 105 and 106 may be formed in the second conductivity type epitaxial layer 100. The insulated isolation regions 105 and 106 may be in contact with the first conductivity type deep well region 130, first and second body regions of the first conductivity 230 and 240, and the first and second N+ body contact regions 360 and 370 of the first conductivity type, depending on the formation position.

According to the example of FIG. 1A, first and second LDD regions 235, 245 of the second conductivity type may be formed, respectively, between the P+ source regions 330 and 340 of the second conductivity type and the gate electrodes 310 and 320. In the present example of FIG. 1A, the first PLDD region 235 and second PLDD region 245 may be formed in the first N-body region 230 and the second N-body region 240, respectively. In such an example, the first and second LDD regions 235 and 245 may be formed using the same mask pattern as the mask pattern used for forming the first N-body region 230 and the second N-body region 240, and also may be formed before the gate electrode. The ion implantation energy of the first and second LDD regions 235, 245 may be lower than an ion implantation energy of the first and second body regions 230 and 240.

According to the example of FIG. 1A, the processes for the first N-body region 230 and the second N-body region 240 and the first PLDD region 235 and second PLDD region 245 may be carried out before the process for the gate electrode occurs. This approach may reduce the demands for photo processing in the semiconductor manufacturing process. A channel region may be formed in a portion of the N-body 230 and 240 disposed between the P-drift region 210 and the first PLDD region 235 and second PLDD region 245 in the PLDMOS device 10. Also, N-type phosphorous (P) ions, as a non-limiting example, may be implanted into the substrate to form the first and second N-type body regions 230 and 240. Further, P-type Indium (In) ions, as a non-limiting example, may also be implanted into the substrate in order to form first and second P-type LDD regions 235 and 245. When the thermal diffusion process is performed after the ion implantation, P-type indium and N-type phosphorus dopants may be diffused together into the substrate. For example, rapid thermal processing (RTP) may be used for the thermal diffusion process. Such an RTP approach may proceed at a temperature of about 800 to 1100° C. The dimensions of the resulting diffused region or the length of such a region may depend on each of the respective diffusivities of the dopants. In this example, because the diffusivity of P-type indium (In) atoms is lower than that of the N-type phosphorous (P) atoms, so the N-type phosphorous (P) dopants after RTP may be diffused into the substrate to a greater extent than the P-type indium dopants. Thus, the channel region may be formed in the N-type body regions doped by phosphorous (P) dopants. Alternatively put, a channel region may be formed between the P-type LDD regions 235 and 245 and the N-type body regions 230 and 240, and thereby a suitable channel length may be secured underneath the gate electrode.

FIG. 1B is a top view illustrating a PLDMOS semiconductor device of a second conductivity type according to an example.

According to the example of FIG. 1B, in the PLDMOS semiconductor device, a deep well region (DNW) 130 may be formed on a substrate. A drift region (P-drift) 210 may overlap with the deep well region 130, wherein there may be a P-N junction between the drift region and the deep well region. A ring-type body region (N-body) 230, 240 may be formed in the drift region 210, wherein a first end 230a of the ring-type body region 230, 240 may extend outside of the drift region 210. A first gate electrode 310 and a second gate electrode 320 may be located on the drift region 210 and the ring-type body region 230, 240, wherein a second end 230b of the ring-type body region 230, 240 may overlap with the first gate electrode 310 and the second gate electrode 320.

According to the example of FIG. 1B, in the PLDMOS semiconductor device, a first P+ source region 330 and a P+ second source region 340 may be formed in the ring-type body region 230, 240. In such an example, P+ drain region 350 may be formed in the drift region 210 and disposed between the first gate electrode 310 and the second gate electrode 320. Also, a first non-silicide layer 610 may be formed on the drift region 210 and may overlap with the first gate electrode 310, where the first non-silicide layer 610 may extend over a top surface of the first gate electrode 410. Additionally, first field plate contact plugs 810 may be formed on the first non-silicide layer 610 and may be in direct contact with the first non-silicide layer 610.

According to the example of FIG. 1B, the PLDMOS semiconductor device may further include a first source contact plug 850 in contact with the first P+ source region 330, a drain contact plug 850 in contact with the P+ drain region 350, and a first gate contact plug 870 located on the first gate electrode, wherein the first field plate contact plugs 880 are each electrically connected with the corresponding first gate contact plug 870 or first source contact plug 850.

According to the example of FIG. 1B, the semiconductor device may further include a first N+ body contact region 360 in the ring-type body region 230, 240 and located to be adjacent to the first P+ source region 330, a second N+ body contact region 370 in the ring-type body region 230, 240 and located to be adjacent to the second P+ source region 340, a second source contact plug 850 in contact with the second source region 340, a second gate contact plug 870 in contact with the second gate electrode 320, and a second body contact plug 860 in contact with the second body contact region 370.

According to the example of FIG. 1B, the semiconductor device may further include a second non-silicide layer 620 located between the P+ drain region 350 and the second gate electrode 320, where the second non-silicide layer 620 may extend over a top surface of the second gate electrode 320, and second field plate contact plugs 820 in contact with the second non-silicide layer 620.

According to the example of FIG. 1B, the first non-silicide layer 610 may be spaced apart from the ring-type body region 230, 240, the first gate contact plug 870 and the drain contact plug 850, and the second non-silicide layer 620 may be spaced apart from the ring-type body region 230, 240, the second gate contact plug 870 and the drain contact plug 850. The first field plate may have a length smaller than a length of the first gate electrode in a same direction. The semiconductor device may have a symmetric structure with respect to the drain contact plug. The ring-type body region may have a depth deeper than a depth of the drift region and may include a first body region and a second body region, as is also shown in FIG. 1A.

Figure 1C:
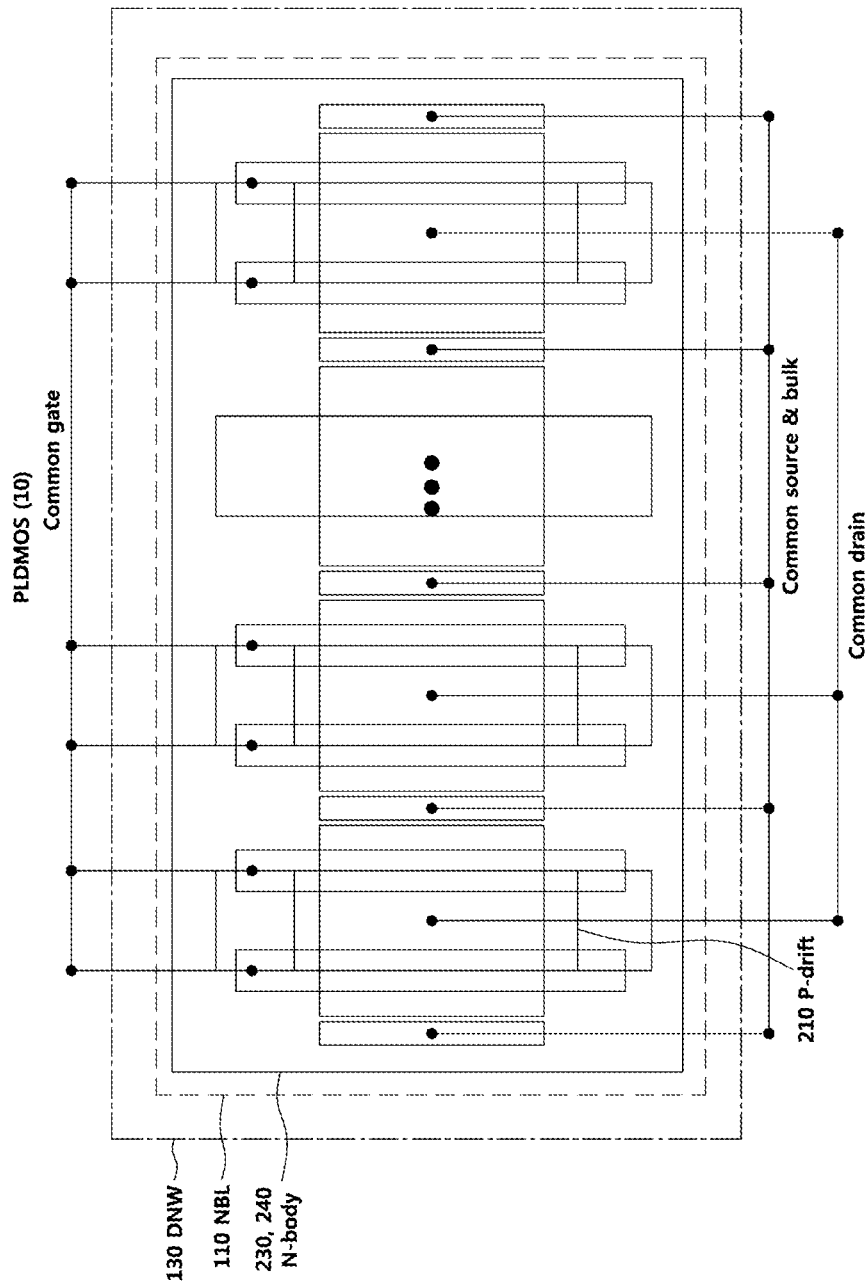
FIG. 1C is a top view illustrating a PLDMOS array structure according to an example.

FIG. 1C is a top view illustrating a PLDMOS array structure according to an example.

As illustrated in the example of FIG. 1C, a plurality of the gate electrodes may be arranged along the horizontal direction, x-axis. The common source and bulk, or body contact, regions 330, 340, 360 and 370 are disposed between the gate electrodes 310 and 320. The common drain regions 350 may also be disposed between the gate electrodes. The P-type drift regions 210 may also be disposed between the gate electrodes 310. P-type drift regions 210 may be spaced apart from each other. The ring-type N-type body region (N-body) 230, 240 may enclose the plurality of the gate electrodes 310 and 320, common source regions 330 and 340, bulk (body contact) regions 360 and 370, and common drain regions 350. The N-type buried layer (NBL) 110 and the deep N-type well region (DNW) 130 may also enclose the plurality of the gate electrodes 310 and 320 in addition to the common source regions 330 and 340, the bulk (body contact) regions 360 and 370 and common drain regions 350.

The deep N-type well region (DNW) 130 may also enclose the outside of the NBL 110 and N-body 230, 240. Outmost source regions 330 and 340 and outmost bulk (body contact) regions 360 and 370 may be located outside with respect to outmost drain regions 350.

Figure 2A:
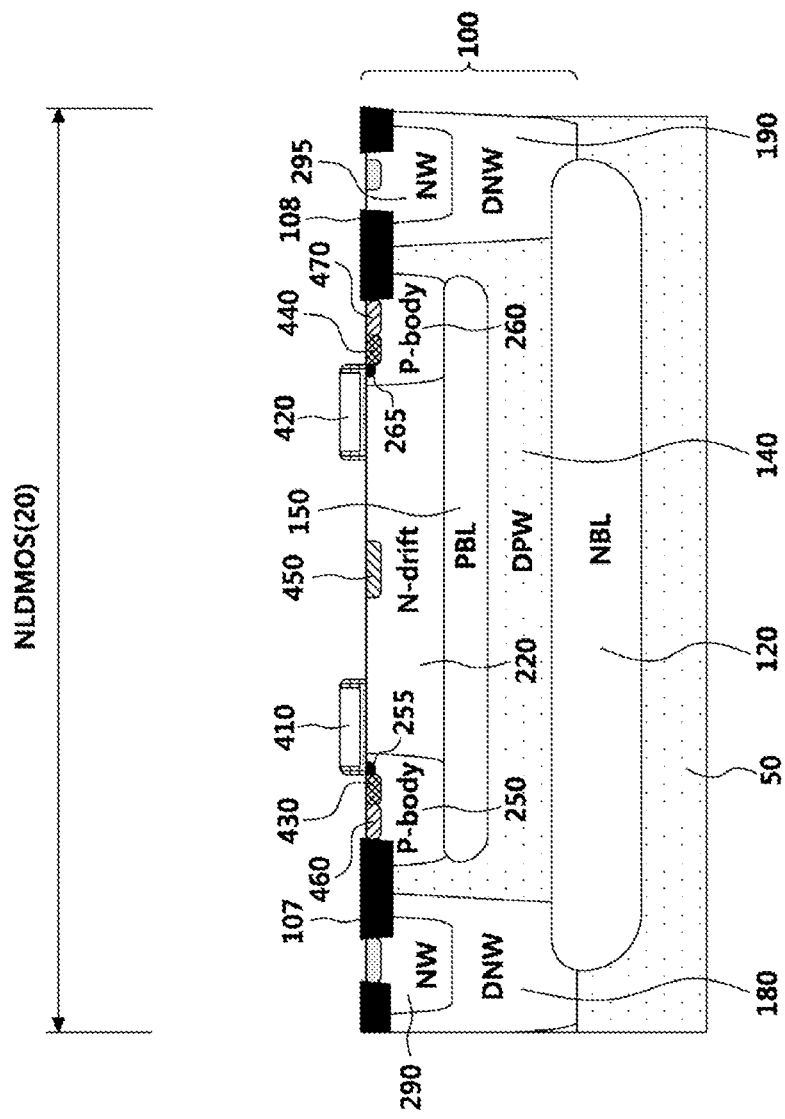
FIG. 2A is a cross-sectional view illustrating an NLDMOS semiconductor device of a first conductivity type according to an example.

FIG. 2A illustrates a structure of the first conductivity type NLDMOS semiconductor device 20 according to an example.

According to the example of FIG. 2A, the first conductivity type NLDMOS semiconductor device may include a semiconductor substrate including a second conductivity type silicon substrate 50. A second buried layer NBL 120 of the first conductivity type that is a heavily doped region may be formed in the silicon substrate 50. In such an example, the NBL 120 may have an opposite conductivity type to that of the silicon substrate 50. Such an NBL 120 may be used for a fully isolated MOS device in a high voltage device. Isolation using the NBL 120 may be aimed at reducing noise caused by switching of the high voltage device. Furthermore, a second conductivity type deep well region (DPW) 140 may be formed on the NBL 120 and the second conductivity type DPW 140 may have a doping concentration lower than a doping concentration of the NBL 120. Thus, in such an example, a drift region of a first conductivity type (N-drift region) 220, first P-body region 250 and second P-body region 260 of a second conductivity type, first and second N+ source regions 430 and 440 of a first conductivity type, a common N+ drain region 450 of a first conductivity type, and first and second P+ body contact regions 460 and 470 of a second conductivity type may be formed in the DPW region 140.

According to the example of FIG. 2A, in the above-described PLDMOS device, the first P-body region 250 and the second P-body region 260 may be formed by ion implantation so as to overlap the N-drift region 220. Accordingly, there may be an overlapping region between the first P-body region 250 and the second P-body region 260 and the N-drift region 220. Because of the counter-doping process, a doping concentration in the overlapping region in the first P-body region 250 and the second P-body region 260 may become smaller than a doping concentration of as-implanted doping concentrations of the first P-body region 250 and the second P-body region 260. The overlapping region between the body regions 250 and 260 and the drift region 220 may be located underneath the gate electrode and the overlapping region may extend to the insulated isolation regions 107 and 108. That is, the overlapping region may be formed underneath the gate electrode and may extend underneath a bottom surface of the insulated isolation regions 107 and 108. The overlapping region may overlap with the insulated isolation regions 107 and 108. A portion outside the overlapping region may have a higher concentration than a portion within the overlapping region.

According to the example of FIG. 2A, furthermore, the first P-body region 250 and the second P-body region 260 may be formed to be deeper than the N-drift region 220. The processing of the first P-body region 250 and the second P-body region 260 may be performed before the processing of the gate electrode. Such a structure is described in further detail, below. In the deep well region 140 of the second conductivity type, a second conductivity type buried layer (PBL) 150 may be formed on the NBL 120. The PBL 150 may be spaced apart from the NBL 120 by the DPW region 140. The PBL 150 may suppress the effects of the operation of the parasitic NPN BJT under the NLDMOS 20, thereby reducing the sub-leakage of the substrate of the NLDMOS. The PBL 150 may be formed below the N-drift region 220 of the NLDMOS 20. In such an example, the PBL 150 may have a length smaller than a length of the NBL 110 or 120.

According to the example of FIG. 2A, the first P-body region 250 and the second P-body region 260 may be formed by implanting dopants at a predetermined tilt angle. The second conductivity type dopants may be implanted into the substrate, in order to form the first P-body region 250 and the second P-body region 260, with a tilt angle of 0 to 20 degrees, as a non-limiting example. Furthermore, first and second gate electrodes 410 and 420 may be formed on a gate insulating layer, and the spacers may be formed on the sidewalls of the first and second gate electrodes 410 and 420. The first and second gate electrodes 410 and 420 may be formed to overlap with the first P-body region 250 and the second P-body region 260 and the N-drift region 220. The first and second gate electrodes 410 and 420 may be disposed between the N+ source regions 430 and 440 of the first conductivity type and the common N+ drain region 450 of the first conductivity type. Also, the first and second gate electrodes 410 and 420 may have the same conductivity type as the N+ source regions 430 and 440 of the first conductivity type.

According to the example of FIG. 2A, furthermore, insulated isolation regions 107 and 108 may be formed to perform isolation with respect to adjacent devices. For example, the insulated isolation regions 107 and 108 may contact the first and second P+ body contact regions 460 and 470 of the second conductivity type or the first P-body region 250 and the second P-body region 260. The insulated isolation regions 107 and 108 may be formed by trench type isolation or LOCOS techniques, as non-limiting examples. Another trench isolation region having a different depth from the insulated isolation regions 107 and 108 may be added into the substrate 50. Also, the insulated isolation regions 107 and 108 may be formed in the second conductivity type epitaxial layer 100. Such insulated isolation regions 107 and 108 may be in contact with the DPW region 140, the second conductivity type first P-body region 250 and second P-body region 260, and also the first and second P+ body contact regions 460 and 470 of the second conductivity type.

According to the example of FIG. 2A, the first NLDD region 255 and the second NLDD region 265 may be formed in the first P-body region 250 and the second P-body region 260, respectively. In addition, the first NLDD region 255 and the second NLDD region 265 may be formed by using the same mask pattern as the first P-body region 250 and the second P-body region 260, and may be formed before the first and second gate electrodes 410 and 420. The ion implantation energy of the first and second LDD regions 255, 265 may be lower than that of the first P-body region 250 and second P-body region 260. First and second LDD regions 255, 265 of a first conductivity type may be formed between the first and second N+ source regions 430 and 440 of the first conductivity type and the first and second gate electrodes 410 and 420.

According to the example of FIG. 2A, processes for the first P-body region 250 and the second P-body region 260 and the first NLDD region 255 and the second NLDD region 265 may be performed before process performed for the first and second gate electrodes 410 and 420. This ordering may reduce one lithography process in the semiconductor manufacturing process, which may result in cost reduction of the fabrication.

According to the example of FIG. 2A, in the NLDMOS device 20, a channel region of the second conductivity type may be formed in the first P-body region 250 and the second P-body region 260. The channel of the second conductivity type may start from the LDD region 255 or 265 and may extend to an end line of the body region 250 or 260. In such an example, the end line may be a junction boundary between the body regions 250, 260 and the N-drift region 220. Boron (B) ions may be implanted into the substrate 50 to form the first P-body region 250 and the second P-body region 260. However, boron ions are a non-limiting example, and in other examples different ions may be implanted. To form the first NLDD region 255 and the second NLDD region 265, arsenic (As) ions may be implanted into the substrate 50. When the thermal diffusion process is performed after the ion implantation, the dopants of boron However, arsenic ions are a non-limiting example, and in other examples different ions may be implanted. Thus, in an example, boron (B) and arsenic (As) may be simultaneously diffused into the substrate. The diffused region or length occurring due to dopant diffusion during the thermal diffusion process may depend on each of the diffusivities of the respective dopants. In the present non-limiting example, because the diffusivity of boron (B) atoms is higher than that of the arsenic (As) atoms, the P-type body region 250, 260 may be formed to enclose the N-type LDD region 255, 265. As a result, a channel region may be formed in the P-type body region 250, 260.

According to the example of FIG. 2A, because the P-type body regions may be formed before forming the gate electrode, the dopants may be easily implanted into a desired location, and the body regions and the LDD regions may be formed using the same mask pattern. As a result, it may be possible to manufacture a semiconductor device while reducing the number of masks.

Figure 2B:
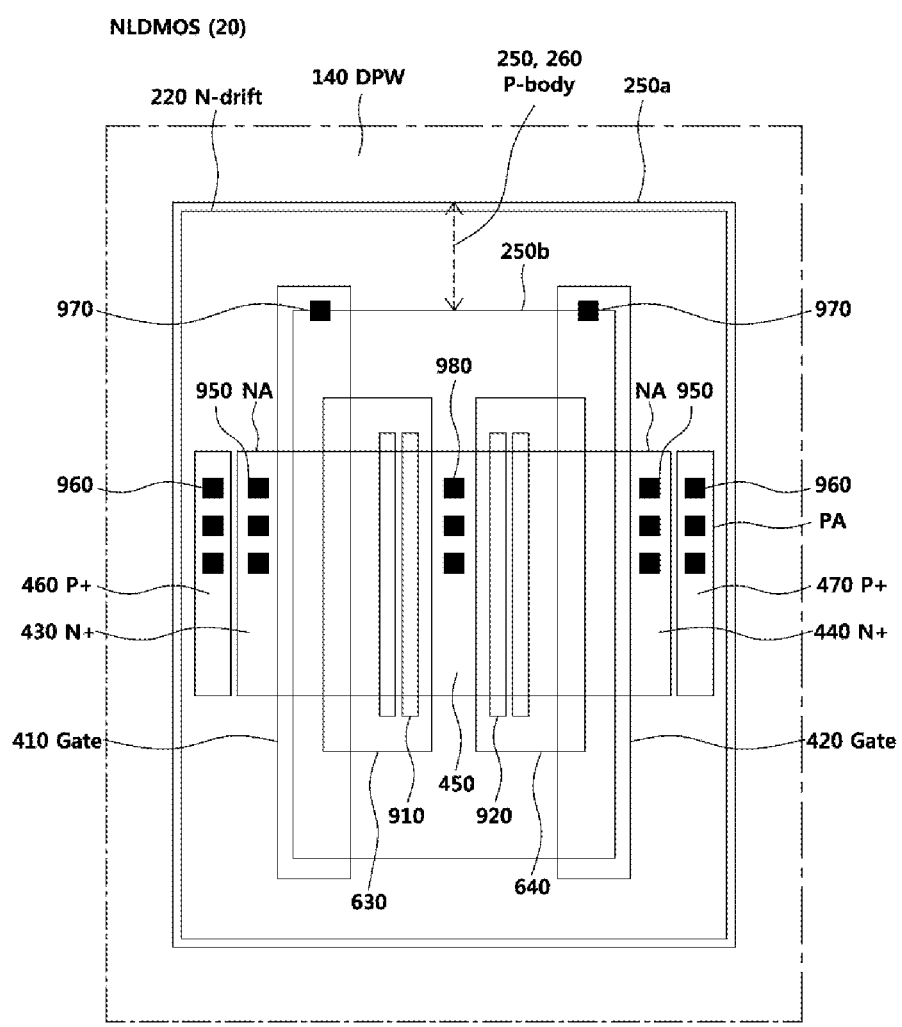
FIG. 2B is a top view illustrating an NLDMOS semiconductor device of a first conductivity type according to an example.

FIG. 2B is a top view illustrating a NLDMOS semiconductor device of a first conductivity type according to an example.

The NLDMOS semiconductor device in the example of FIG. 2B is very similar to that of PLDMOS semiconductor device as shown in FIG. 1A. However, the conductivity type of NLDMOS semiconductor device is different from that of the PLDMOS semiconductor device.

According to the example of FIG. 2B, in the NLDMOS semiconductor device, a deep well region (DPW) 140 may be formed on a substrate. A drift region (N-drift) 220 may overlap with the deep well region 140, in which there may be a P-N junction between the drift region 220 and the deep well region 140. A ring-type body region 250, 260 may be formed in the drift region 220, wherein a first end 250a of the ring-type body region 250, 260 may extend outside the drift region 220. A first gate electrode 410 and a second gate electrode 420 may be formed on the drift region 220 and the ring-type body region 250, 260, such that a second end 250b of the ring-type body region 250, 260 may overlap with the first gate electrode 410 and the second gate electrode 420.

According to the example of FIG. 2B, in the NLDMOS semiconductor device, a first N+ source region 430 and a second N+ source region 440 may be formed in the ring-type body region 250, 260. An N+ drain region 450 may be formed in the drift region 220 and may be disposed between the first gate electrode 410 and the second gate electrode 420. A first non-silicide layer 630 may be formed on the drift region 220 and may overlap with the first gate electrode 410. In such an example, the first non-silicide layer 630 extends over a top surface of the first gate electrode 410. First field plate contact plugs 910 may be formed on the first non-silicide layer 630 and may be in direct contact with the first non-silicide layer 630.

According to the example of FIG. 2B, the NLDMOS semiconductor device may further include a first source contact plug 950 in contact with the first source region 430, a drain contact plug 950 in contact with the drain region 450, and a first gate contact plug 970 located on the first gate electrode, such that the first field plate contact plugs 880 may be electrically connected with the first gate contact plug 970 or the first source contact plug 950.

According to the example of FIG. 2B, the semiconductor device may further include a first body contact region 460 located in the ring-type body region 250, 260 and located adjacent to the first source region 430, a second body contact region 470 located in the ring-type body region 250, 260 and located adjacent to the second source region 440, a second source contact plug 950 in contact with the second source region 440, a second gate contact plug 970 in contact with the second gate electrode 420, and a second body contact plug 960 in contact with the second body contact region 470.

According to the example of FIG. 2B, the semiconductor device may further include a second non-silicide layer 640 located between the drain region 450 and the second gate electrode 420, wherein the second non-silicide layer 640 may extend over a top surface of the second gate electrode 420, and second field plate contact plugs 920 in contact with the second non-silicide layer.

According to the example of FIG. 2B, the first non-silicide layer may be spaced apart from the ring-type body region, the first gate contact plug and the drain contact plug, and the second non-silicide layer may be spaced apart from the ring-type body region, the second gate contact plug and the drain contact plug. The first field plate may have a length smaller than a length of the first gate electrode in a same direction. Also, the semiconductor device may have a symmetric structure with respect to the drain contact plug. The ring-type body region may have a same depth as the drift region, and the ring-type body region may include a first body region and a second body region, as shown in the example of FIG. 2A.

FIG. 2C is a top view illustrating an NLDMOS array structure according to an example.

As illustrated in the example of FIG. 2C, a plurality of the gate electrodes may be arranged in the horizontal direction (x-axis). The common source and bulk (body contact) regions 430, 440, 460 and 470 may be disposed between the gate electrodes 410 and 420. The common drain regions 450 may also be disposed between the gate electrodes. The ring-type P-type body region (P-body) 250, 260 may enclose the plurality of the gate electrodes 410 and 420, the common source regions 430 and 440, the bulk (body contact) regions 460 and 470 and the common drain regions 450. The N-type buried layer (NBL) 120 and the deep P-type well region (DPW) 140 may also enclose the plurality of the gate electrodes 410 and 420 as well as the common source regions 430 and 440, the bulk (body contact) regions 460 and 470 and the common drain regions 450. The NBL 120 may also enclose an outside of the deep P-type well region (DPW) 140 and N-body 250, 260. Outmost source regions 430 and 440 and outmost bulk (body contact) regions 460 and 470 may be located outside with respect to outmost drain regions 450.

FIGS. 3 to 13 are cross-sectional views illustrating a manufacturing process of a high voltage semiconductor device, according to an example.

Figure 3:
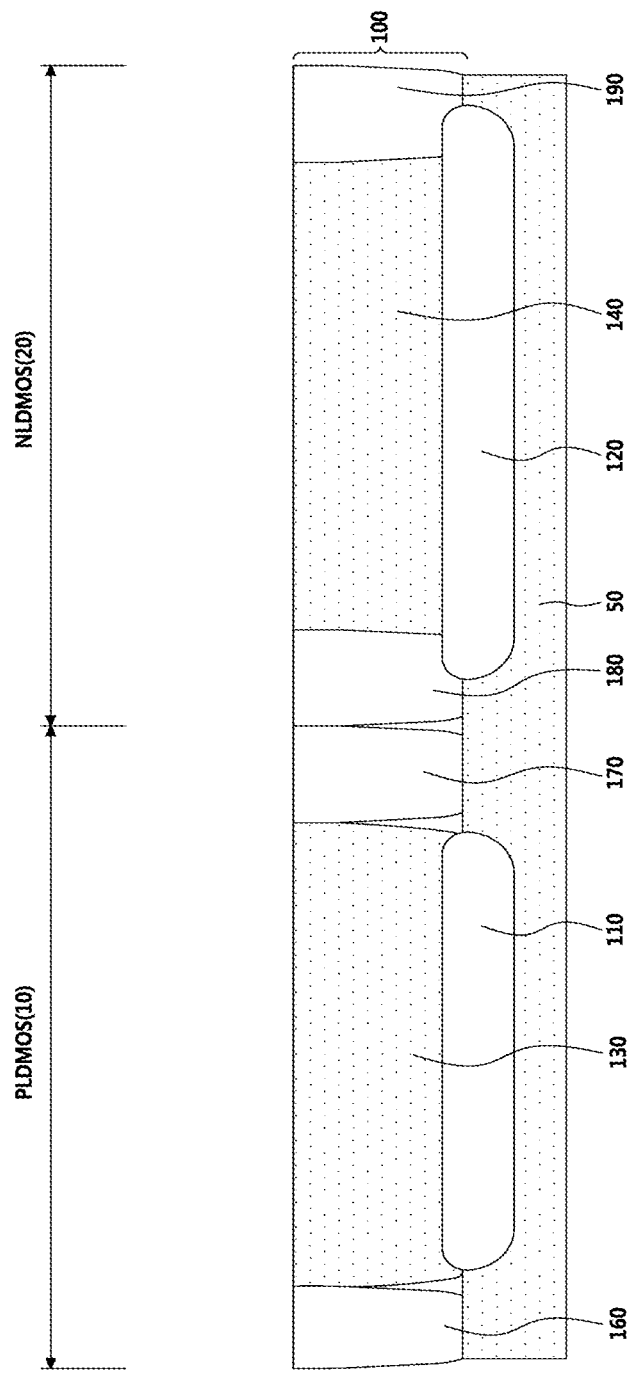
FIGS. 3 to 13 are cross-sectional views illustrating a manufacturing process of a high voltage semiconductor device according to an example.

Referring to the example of FIG. 3, the PLDMOS 10 and the NLDMOS 20 may be simultaneously implemented in one silicon substrate 50 of a second conductivity type. First conductivity type buried layers NBL 110 and 120 may be formed in one silicon substrate 50 of a second conductivity type. The second conductivity type epitaxial layer (P-epi) 100 having a low concentration may be formed on the first conductivity type buried layers 110 and 120.

Referring to the example of FIG. 3, in the PLDMOS 10, the deep well region DNW region 130 of the first conductivity type may be formed on the first conductivity type buried layer NBL 110 (the first buried layer). In addition, the guard rings 160 and 170 of the second conductivity type may be formed on the left and right sides of the DNW region 130.

Referring to the example of FIG. 3, in the NLDMOS 20, the deep well region DPW region 140 of the second conductivity type may be formed on the NBL 120, the second buried layer. The guard rings 180 and 190 of the first conductivity type may be formed on the left and right sides of the DPW region 140. The guard rings 180 and 190 of the first conductivity type may be formed to be in contact with the NBL 120, the second buried layer, of the first conductivity type. Thus, the NLDMOS device may be formed to be completely electrically isolated from the nearby device and/or the substrate.

Referring to the example of FIG. 3, the DNW region 130 and the guard rings 180 and 190 of the first conductivity type may all be formed using the same DNW mask pattern. Similarly, the DPW region 140 and the guard rings 160 and 170 of the second conductivity type may also all be formed using the same DPW mask pattern. The deep well and isolation regions may be formed in the P-epi 100.

Figure 4:
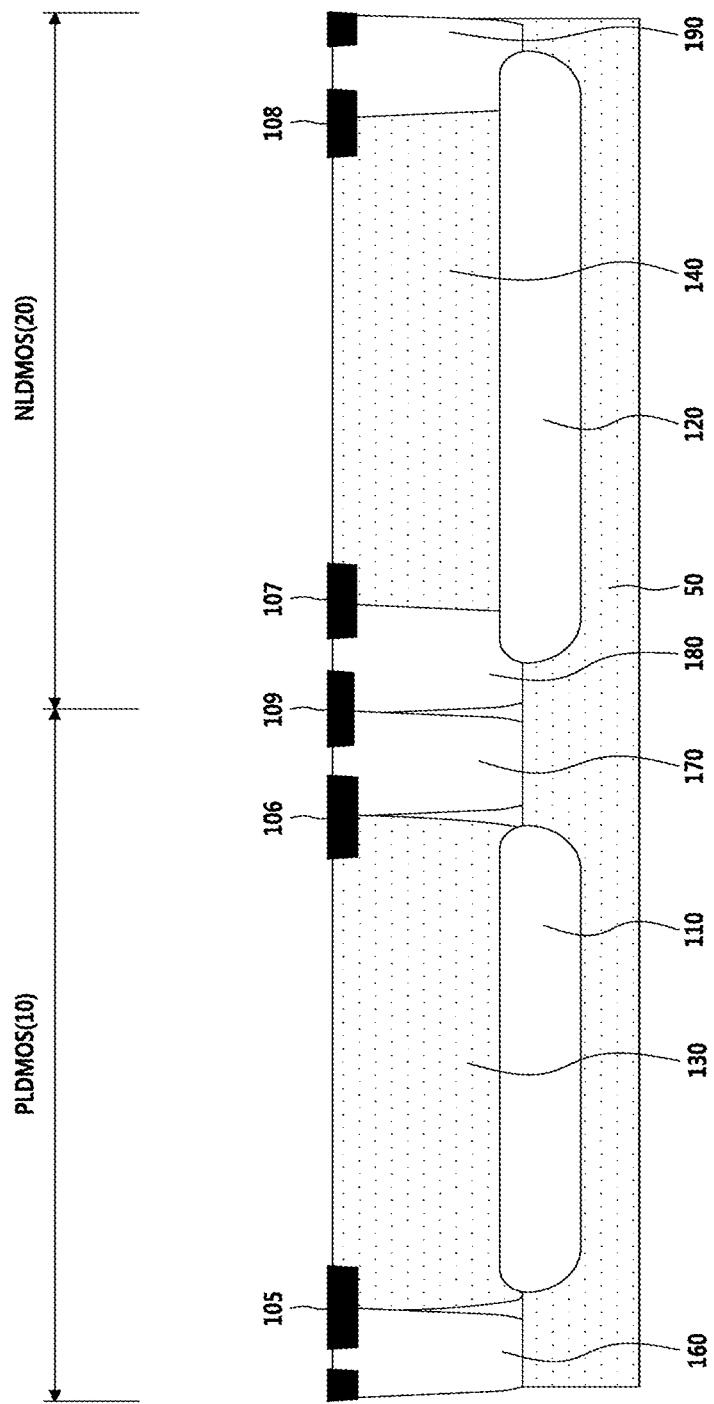

Subsequently, as illustrated in the example of FIG. 4, a plurality of insulated isolation regions 105 to 109 with trench type of LOCOS type may be formed in the silicon substrate 50. The plurality of insulated isolation regions 105 to 109 may be principally formed at each interface of interfaces between the deep well regions 130, 140 and the guard rings 160-190. In addition, the plurality of insulated isolation regions 105 to 109 may be filled with insulating materials, such as silicon oxide (SiO$_2$), as a non-limiting example.

Figure 5:
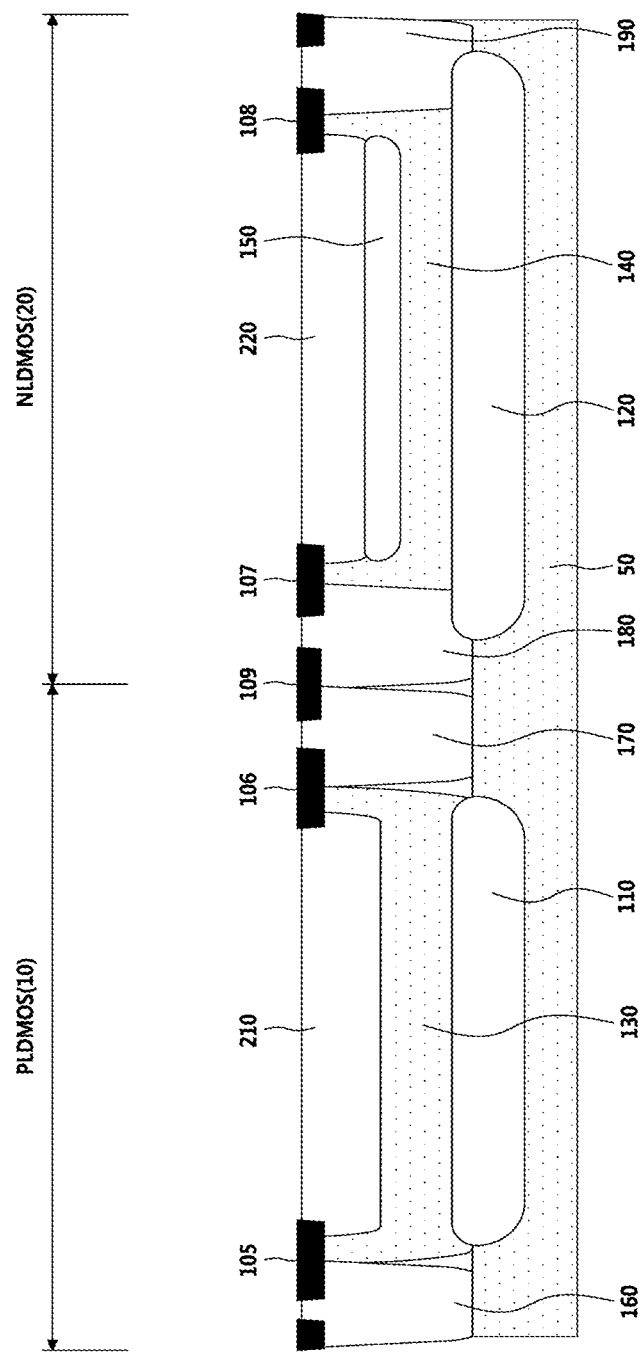

As illustrated in the example of FIG. 5, when the plurality of insulated isolation regions 105 to 109 are formed, the buried layer PBL 150 of the second conductivity type may formed in the DPW region 140 using an N-drift mask pattern. The buried layer PBL 150 may have an opposite conductivity type to the NBL 120 (second buried layer). The NBL 120 (second buried layer) may be formed between the silicon substrate 50 and the DPW region 140. However, the PBL 150 (third buried layer) may be formed inside the DPW region 140. The PBL 150 (third buried layer) may serve to suppress or reduce parasitic bipolar junction transistor BJT operation that may occur at the lower part of the NLDMOS. Therefore, the PBL 150 (third buried layer) may serve to reduce the sub-leakage of NLDMOS.

As illustrated in the example of FIG. 5, the PBL 150 may be located above the NBL 110, 120, and may be located below the N-drift region 220. In the NLDMOS device 20, the NDRFIT 220 may be formed in the DPW region 140 using an N-drift mask pattern. As a non-limiting example, the PBL 150 may be formed, and then a N-drift region 220 may be formed. Alternatively, in another non-limiting example, these elements may be formed in the reverse order. That is, the N-drift region 220 is formed, and the PBL 150 may be formed in another non-limiting example. However, in such an example, regardless of the processing order, the N-drift region 220 and the PBL 150 may be formed using a same NDRFT mask pattern. Accordingly, there may be an advantage that the manufacturing cost may be reduced by using such a same NDRFT mask pattern. By using the same N-drift mask pattern and using different ion implantation energies, the N-drift region 220 and the PBL 150 may formed having different depths. In the PLDMOS device 10, a P-drift region 210 may be formed using a P-drift mask pattern. The P-drift region 210 is formed in the DNW region 130 and above the NBL 110.

Figure 6:
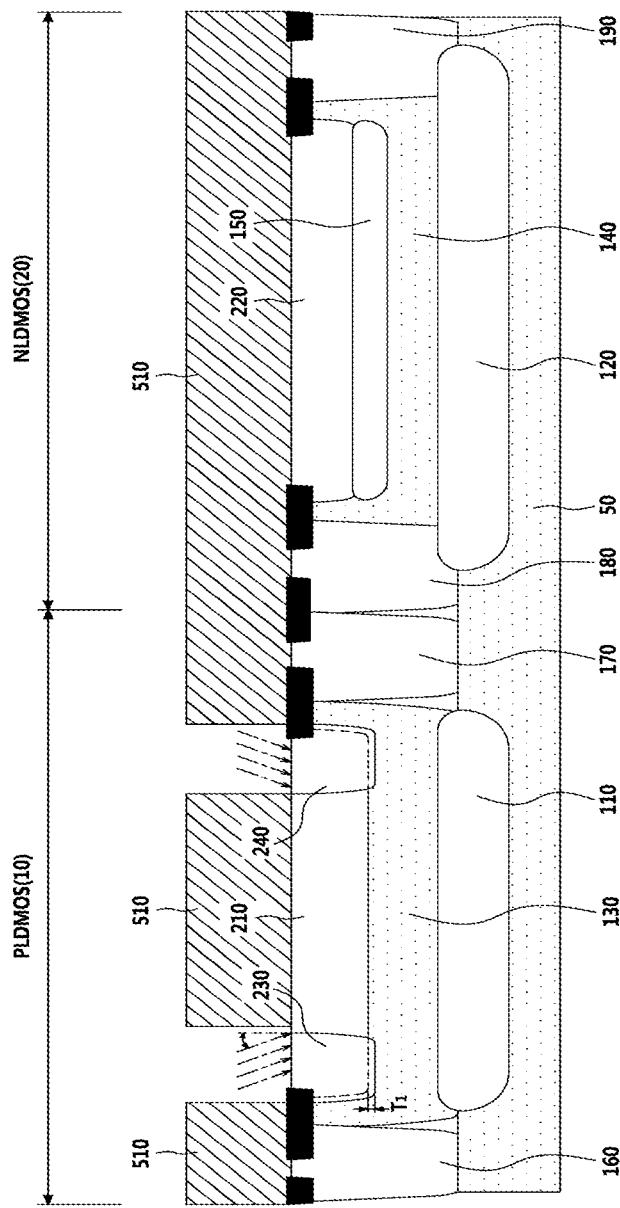

FIG. 6 illustrates a process of forming the first N-body region 230 and the second N-body region 240 in the drift region of the second conductivity type in the PLDMOS 10 device. As illustrated in the example of FIG. 6, the first N-body region 230 and the second N-body region 240 may be formed at opposite ends of the P-drift region 210 using the N-body mask pattern 510. The N-body mask pattern 510 may block all of the NLDMOS 20 regions so as to prevent the NLDMOS 20 regions from being ion implanted.

FIG. 6 illustrates that first ion implantation using a tilt angle may performed to form the first N-body region 230 and the second N-body region 240. According to the example, the first ion implantation may performed using a tilt angle from 0 to 20 degrees with respect to a Y-axis perpendicular to a top surface of the substrate. As a non-limiting example, phosphorus (P) dopants are implanted into the substrate as an N-type (first conductivity type) dopant, though other dopants may be used in other examples.

FIG. 6 illustrates that the first N-body region 230 and the second N-body region 240 may be formed to partially overlap the P-drift region 210. In addition, the first N-body region 230 and the second N-body region 240 may have a depth deeper than a depth of the P-drift region 210. Such a different depth is illustrated as being "T1" in the example of FIG. 6. The first N-body 230 and the second N-body region 240 may be formed to extend further on one side of the P-drift region 210.

Figure 7:
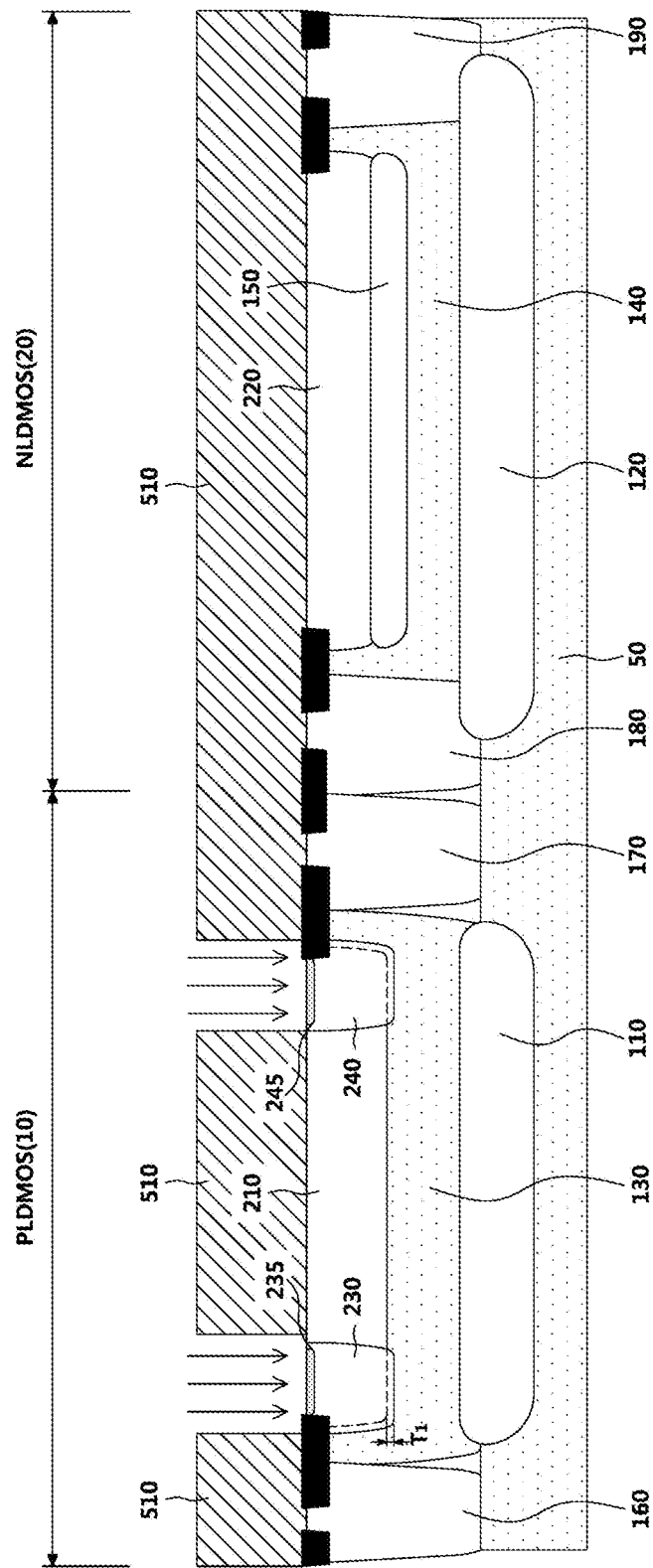

Thereafter, as illustrated in the example of FIG. 7, the first PLDD region 235 and the second PLDD region 245 may be formed on the first N-body region 230 and the second N-body region 240, respectively. The first PLDD region 235 and the second PLDD region 245 may be formed by ion implantation using the N-body mask pattern 510, without using a tilt angle. The N-body mask pattern 510 may also be used for forming the first N-body region 230 and the second N-body region 240. Each of the respective ion implantation energies of the first PLDD region 235 and second PLDD region 245 may be lower than each of the respective ion implantation energies of the first N-body region 230 and the second N-body region 240. By reducing the number of masks, the process cost may be reduced accordingly. When the first PLDD region 235 and second PLDD region 245 are formed, as a non-limiting example, indium (In) ions may be implanted. After the N-body mask pattern 510 is removed, a high temperature drive-in annealing process may be performed to facilitate diffusion of the dopants.

As illustrated in the examples of FIGS. 6 and 7, in the PLDMOS device 10, phosphorus (P) dopants may be implanted to form the first N-body region 230 and the second N-body region 240. Indium (In) dopants may be implanted to form the first PLDD region 235 and second PLDD region 245. Then, a high temperature drive-in process for dopants diffusion may be performed to form a first channel between the PLDD region 235 or 245 and the P-drift region 210.

Figure 8:
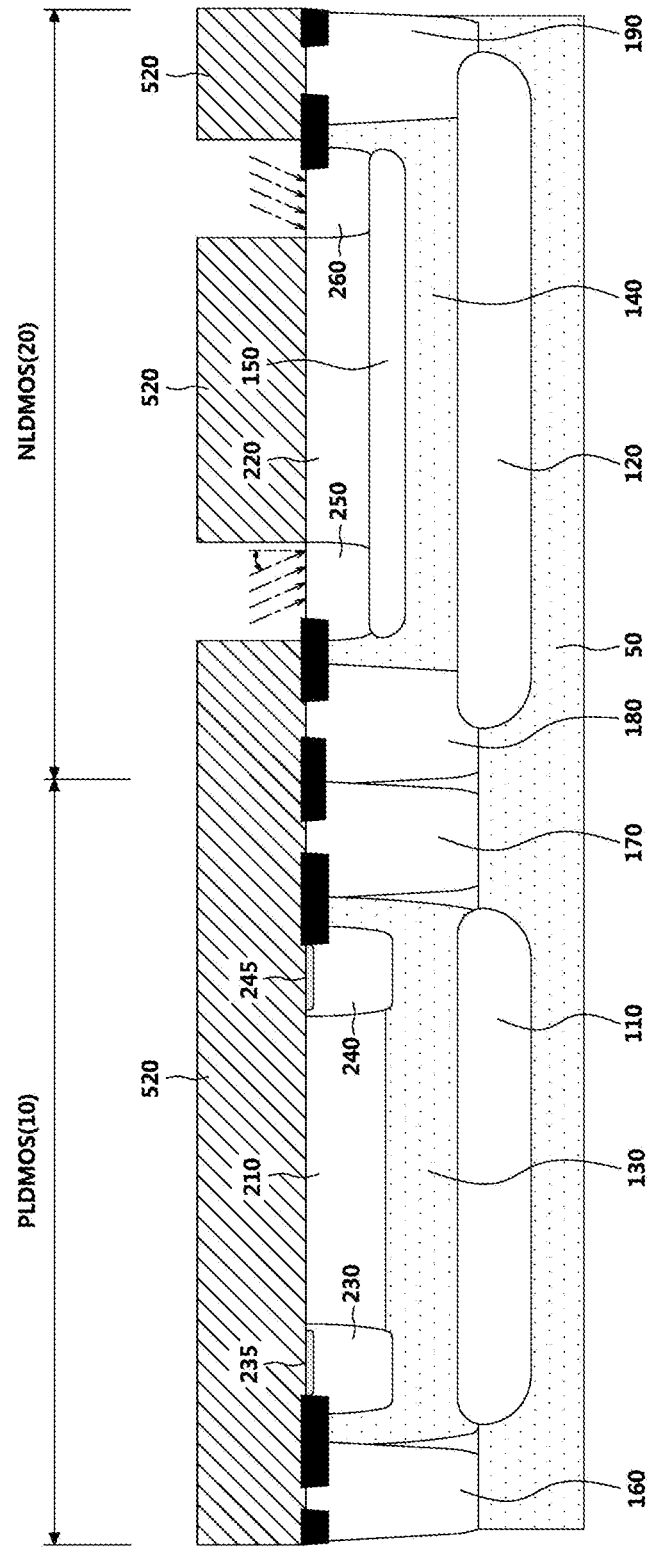

FIG. 8 illustrates a process of forming first and second P-body regions in the N-drift region in the NLDMOS device 20. Using a P-body mask pattern 520 as a mask, a first P-body region 250 and a second P-body region 260 may be formed at opposite ends of the N-drift region 220 by ion implantation with tilted angles, respectively. The P-body mask pattern 520 may block all of the PLDMOS region 10 so as to cause the PLDMOS region 10 not to be ion implanted. According to the example of FIG. 8, the tilted angle may range from 0 to 20 degrees with respect to a Y-axis that is perpendicular to a top surface of the substrate. For example, boron (B) dopants may be implanted into the substrate 50 to form the P-body regions 250 and 260. After the P-body mask pattern 520 is removed, a high temperature drive-in annealing process may be performed in order to diffuse the implanted dopants.

As illustrated in the example of FIG. 8, in the NLDMOS device 20, the first P-body region 250 and the second P-body region 260 may formed to be deep enough to be connected to the PBL 150 (third buried layer). In order to apply a specific voltage to the PBL 150 (third buried layer), the PBL 150 (third buried layer) may connect to the first P-body region 250 and the second P-body region 260.

Figure 9:
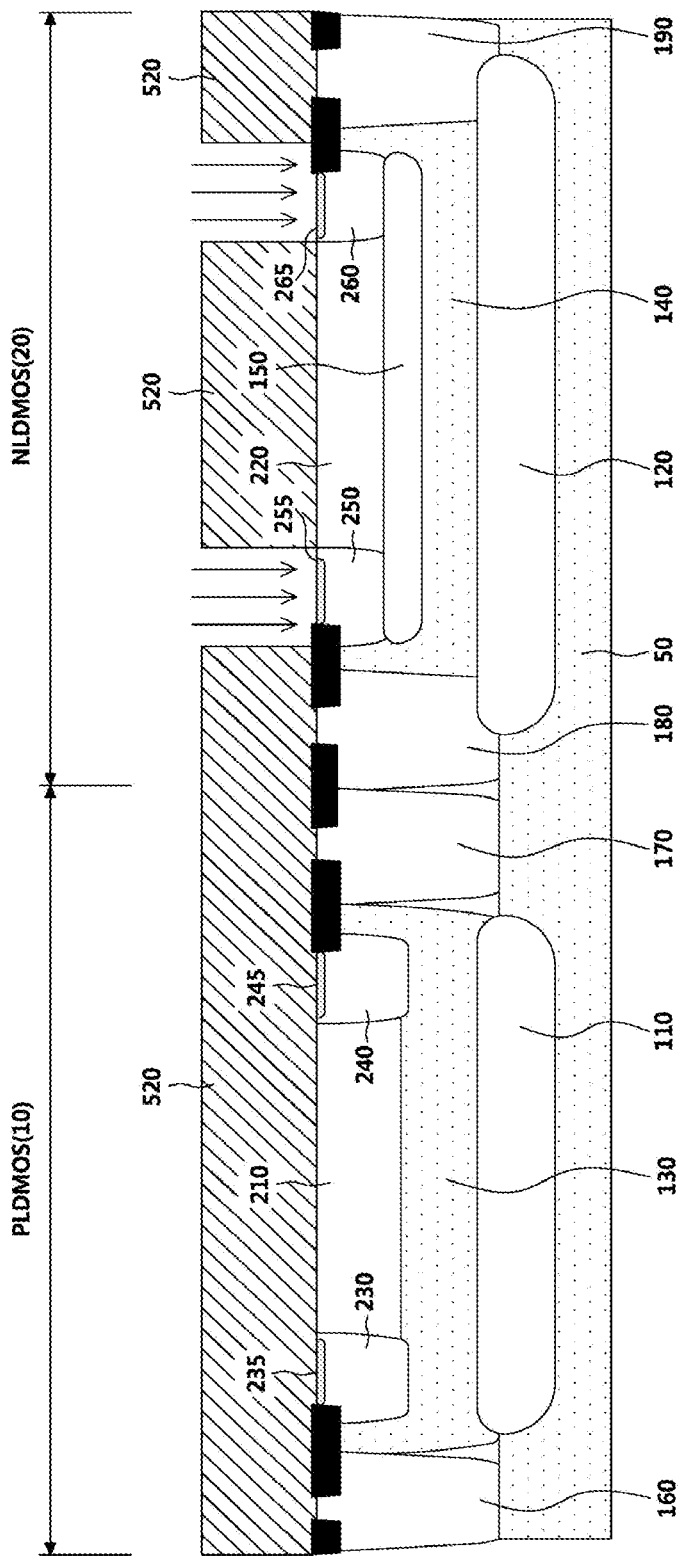

Thereafter, as illustrated in the example of FIG. 9, In the NLDMOS device 20, an ion implantation with arsenic (As) dopants, as a non-limiting example, may be performed to form a first NLDD region 255 and a second NLDD region 265 using the same P-body mask pattern 520, without using a tilted angle for the implantation. Therefore, the first NLDD region 255 and the second NLDD region 265 may be formed in the P-body regions 250 and 260 according to such an example. By reducing the number of masks in such an example, the processing cost may be reduced.

Figure 10:
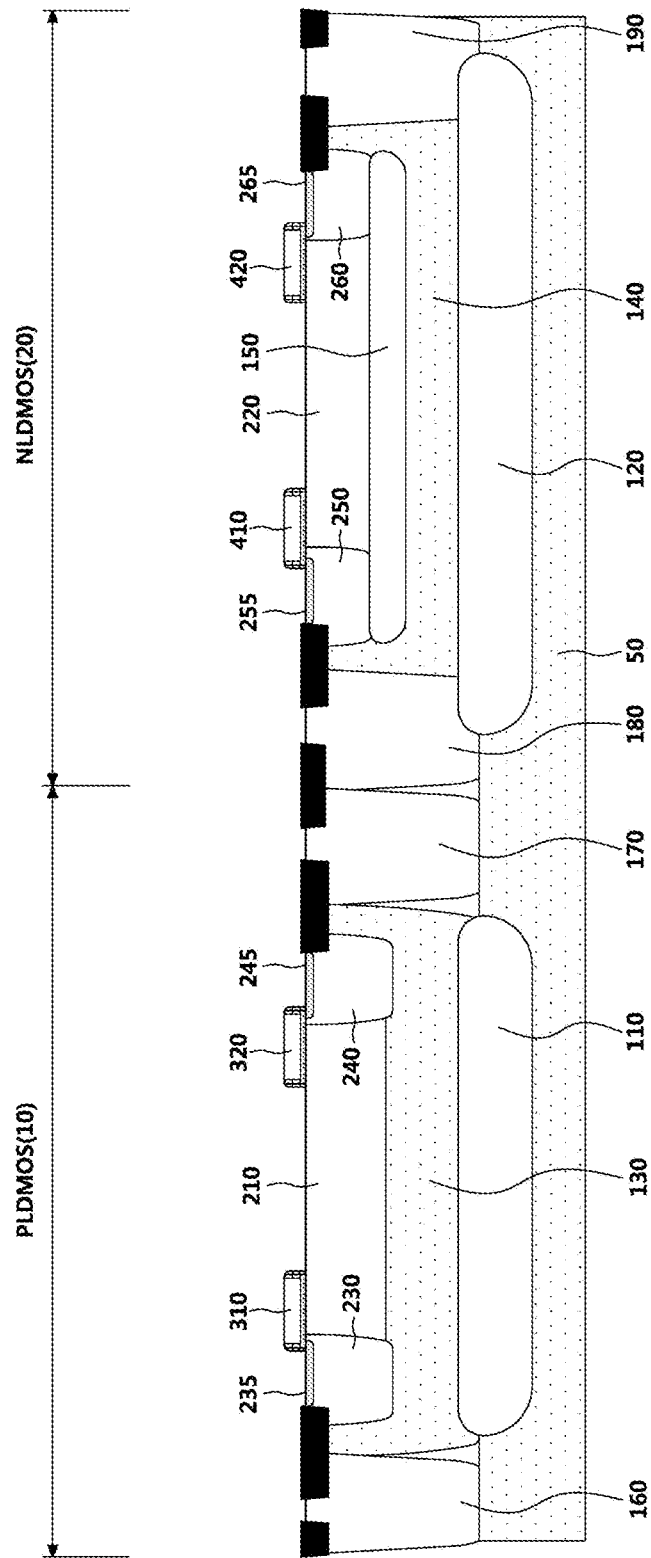

FIG. 10 illustrates that the gate electrodes 310, 320, 410, and 420 may be formed after the body regions 230, 240, 250 and 260 and the LDD regions 235, 245, 255, and 265 are formed. In the typical approaches, the body regions 230, 240, 250 and 260 and the LDD regions 235, 245, 255, and 265 may be formed after the gate electrodes are formed, but in the present example the body regions 230, 240, 250 and 260 and the LDD regions 235, 245, 255, and 265 are formed in the reverse order, that is, before the gate electrodes are formed. Reasoning for such an approach is described in further detail, above. The plurality of gate electrodes 310, 320, 410, and 420 may be formed on the gate insulating layer formed on the silicon substrate 50, as illustrated in the example of FIG. 10. First and second spacers may be formed on sidewalls of gate electrodes 310, 320, 410, and 420. In the drawing, FIG. 10 shows that four gate electrodes 310, 320, 410, and 420 are formed, in total, and the four gate electrodes 310, 320, 410, and 420 are formed on the drift regions 210 and 220 of the first conductivity type or the second conductivity type.

Figure 11:
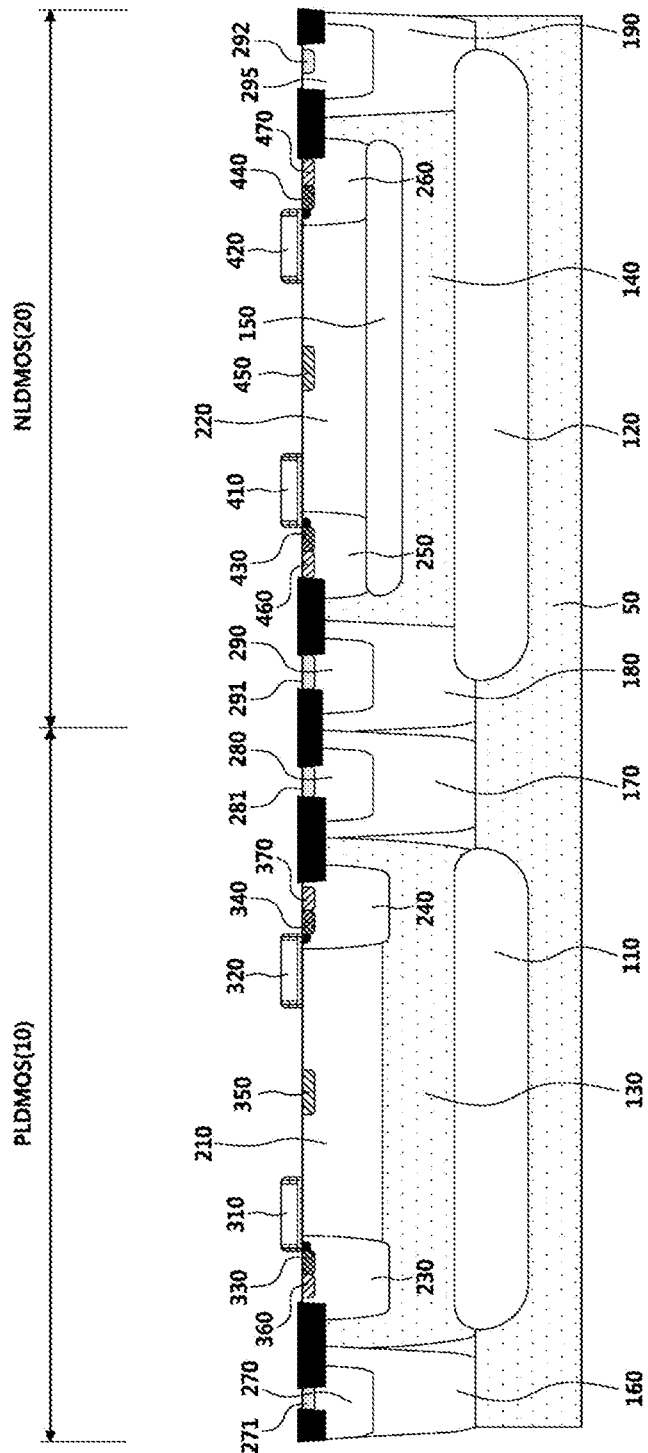

Next, as illustrated in the example of FIG. 11, the P-type well (PW) regions 270 and 280 of the second conductivity type may be formed in the guard rings 160 and 170 of the second conductivity type. Additionally, N-type well (NW) regions 290 and 295 of the first conductivity type may be formed in the guard rings 180 and 190 of the first conductivity type. The NW regions 290 and 295 of the first conductivity type and the PW regions 270 and 280 of the second conductivity type may be formed using a gate electrode as a mask in order to reduce the number of masks. Therefore, formation of the NW regions 290 and 295 of the first conductivity type and the PW regions 270 and 280 of the second conductivity type may proceed after the formation of the gate electrodes 310, 320, 410 and 420.

In addition, first and second P+ source regions 330 and 340 of the second conductivity type may be formed in the first N-body region 230 and the second N-body region 240, respectively. The common P+ drain region 350 of the second conductivity type may be formed in the P-drift region 210. The first and second N+ body contact regions 360 and 370 of the first conductivity type may be formed next to the first and second P+ source regions 330 and 340 of the second conductivity type, respectively.

Similarly, the first and second N+ source regions 430 and 440 of the first conductivity type may be formed in the first and second P-body region 250 and 260, respectively. In a similar manner, the first and second P+ body contact regions 460 and 470 of the second conductivity type may be formed in the first and second P-body regions 250 and 260, respectively. A common N+ drain region 450 of the first conductivity type may be formed in the N-drift region 220. Silicide layers 380 and 480 may be formed on the body contact regions 360, 370, 460 and 470 to form an ohmic contact structure with the substrate.

Then, N+ doped regions 291 may be formed in the NW regions 290 and 295 of the first conductivity type. Similarly, P+ doped regions 271, 281 are formed in the PW regions 270 and 280 of the second conductivity type. The N+ doped regions 291 may be formed together when the N+ source/drain regions 430, 440, and 450 are formed. In addition, the P+ doped regions 271, 281 may be formed together when the P+ body contact regions 460 and 470 are formed. The N+ doped regions 291, 292 and the P+ doped regions 271, 281 may both be formed to lower the resistance of each well region. In addition, silicide layers 380 and 480 may be formed on each of the N+ and P+ doped regions 271, 281, 291, and 292.

Figure 12:
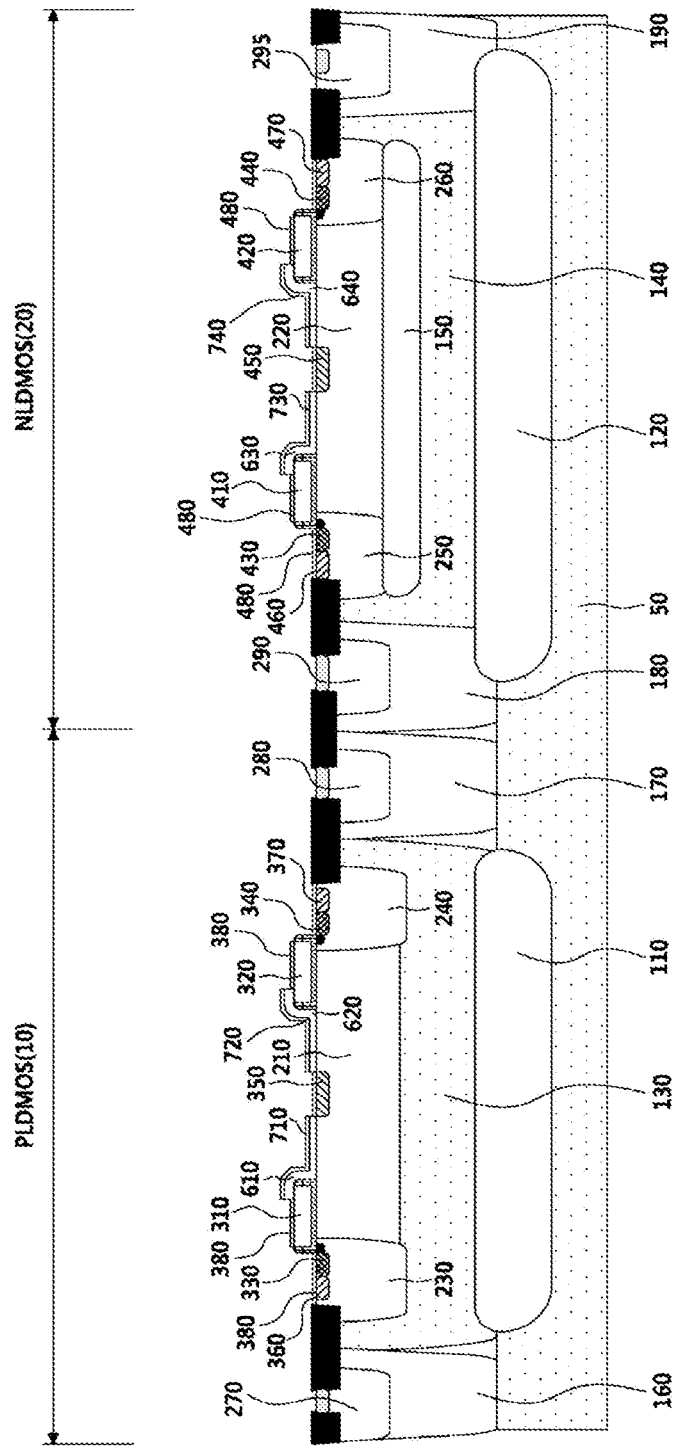

As illustrated in the example of FIG. 12, first silicide 380 and second silicide 480 may be formed on a portion of the N+ and P+ body contact regions 360, 370, 460, 470, and the source regions and the drain regions 330, 340, 350, 430, 440, 450 and on the gate electrodes 310, 320, 410, 420. For example, the first silicide 380 and second silicide 480 may be formed around the region where the contact plug is to be formed, and the remaining regions may prevent the silicide layer from being formed on the silicon substrate 50 through a non-silicide processing.

As illustrated in the example of FIG. 12, furthermore, between the gate electrode and the drain region, patterned first insulating films 610, 620, 630, and 640 may be formed to secure the non-silicide region, and the patterned second insulating films 710, 720, 730, and 740 may be formed on the patterned first insulating films 610, 620, 630, and 640 in order to serve as an etch-stop layer for forming the field plate plugs 810, 820, 830, and 840. The patterned second insulating films 710, 720, 730, and 740 may be formed in the same shape as the patterned first insulating films 610, 620, 630, and 640. The patterned first and second insulating films 610, 620, 630, 640, 710, 720, 730, and 740 collectively may be referred to as protective film patterns or non-silicide layers, non-silicide patterns.

Figure 13:
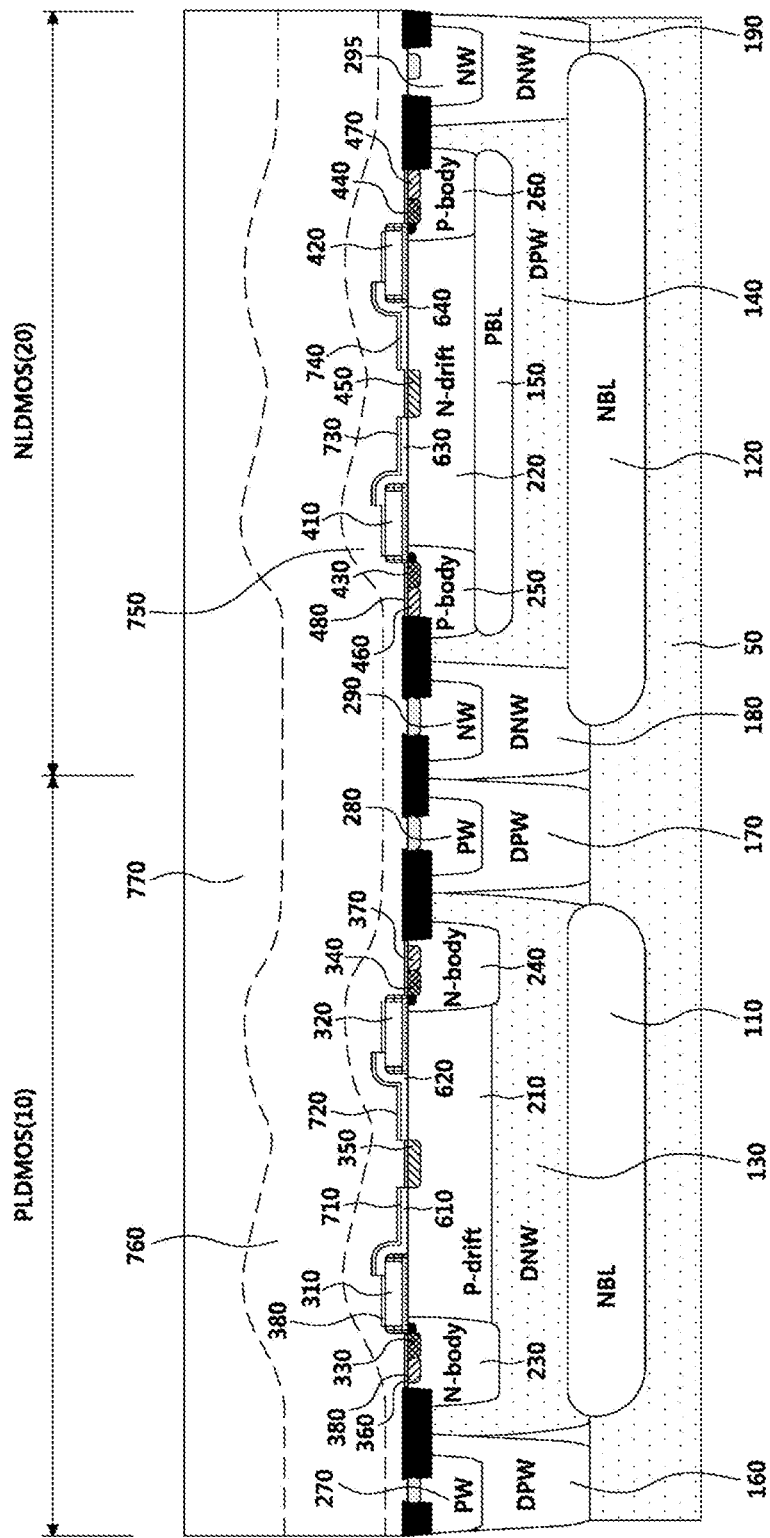

As illustrated in the example of FIG. 13, a borderless contact etch stopping layer 750, made of a material such as SiON, SiN, and so on, as non-limiting examples, may be formed on the first non-silicide layer and the silicide layer. A first interlayer insulating layer 760, such as borophosphosilicate glass (BPSG), phosphosilicate glass (PSG), and so on, as non-limiting examples, is formed on the borderless contact etch stopping layer. A second interlayer insulating layer 770, made of a material such as a tetraethyl orthosilicate (TEOS) as a non-limiting example, may be formed on the first interlayer insulating layer 770, and metal layers 1010, 1020, 1030 and 1040 may be formed on the interlayer insulating layer, as shown in further detail in the examples of FIG. 14 and FIG. 15. In such examples, the borderless contact etch stopping layer 750 may have a thickness thinner than a thickness of the first interlayer insulating layer 760 or the second interlayer insulating layer 770. The borderless contact etch stopping layer 750 may be used for forming a borderless contact hole in the semiconductor device. Such a borderless contact hole may be formed on an interface between the active regions NA and PA and the insulated isolation regions 105 and 106.

Figure 14:
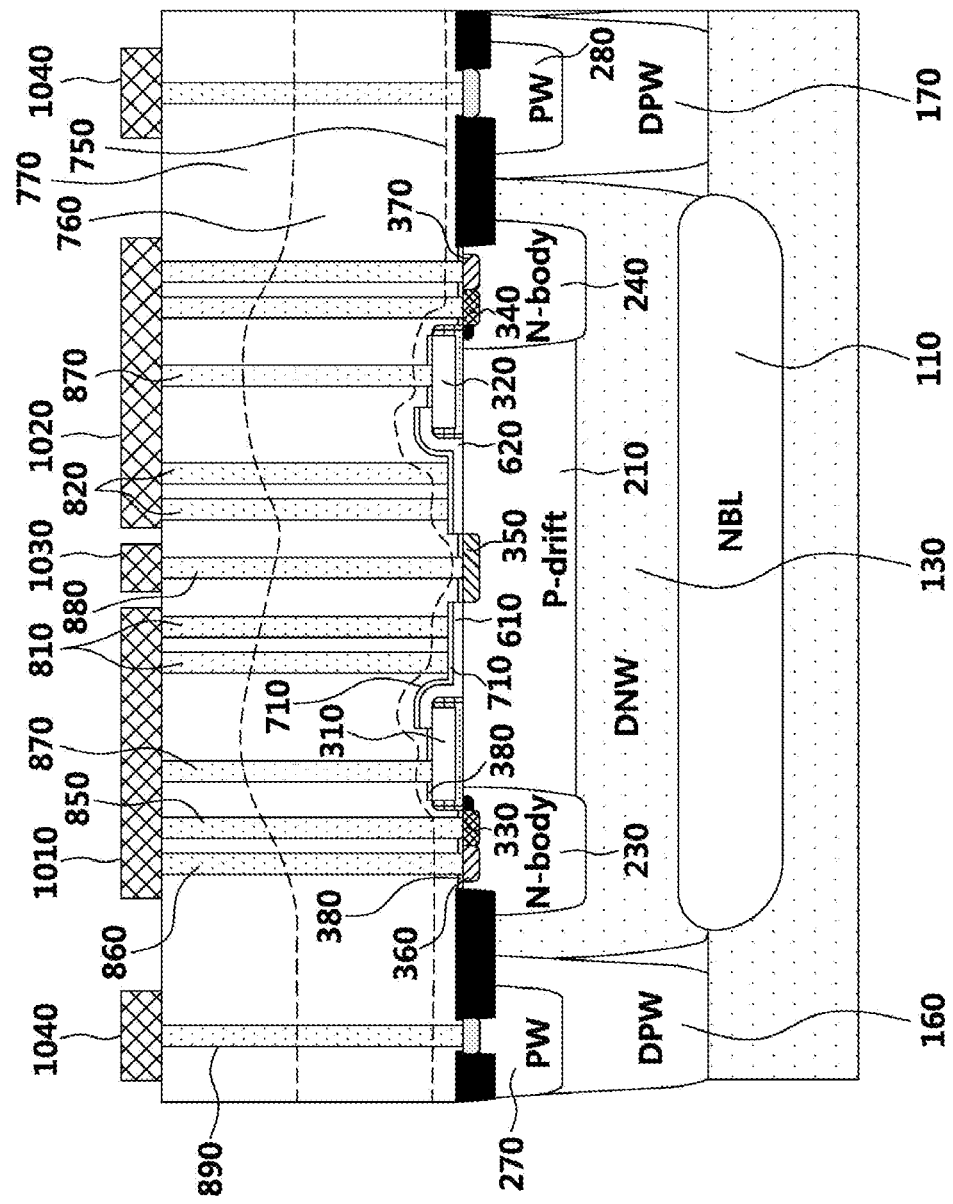
FIG. 14 and FIG. 15 are structures in which the field plate plugs are formed in a semiconductor device of a PLDMOS and an NLDMOS, respectively, according to the present examples.
Figure 15:
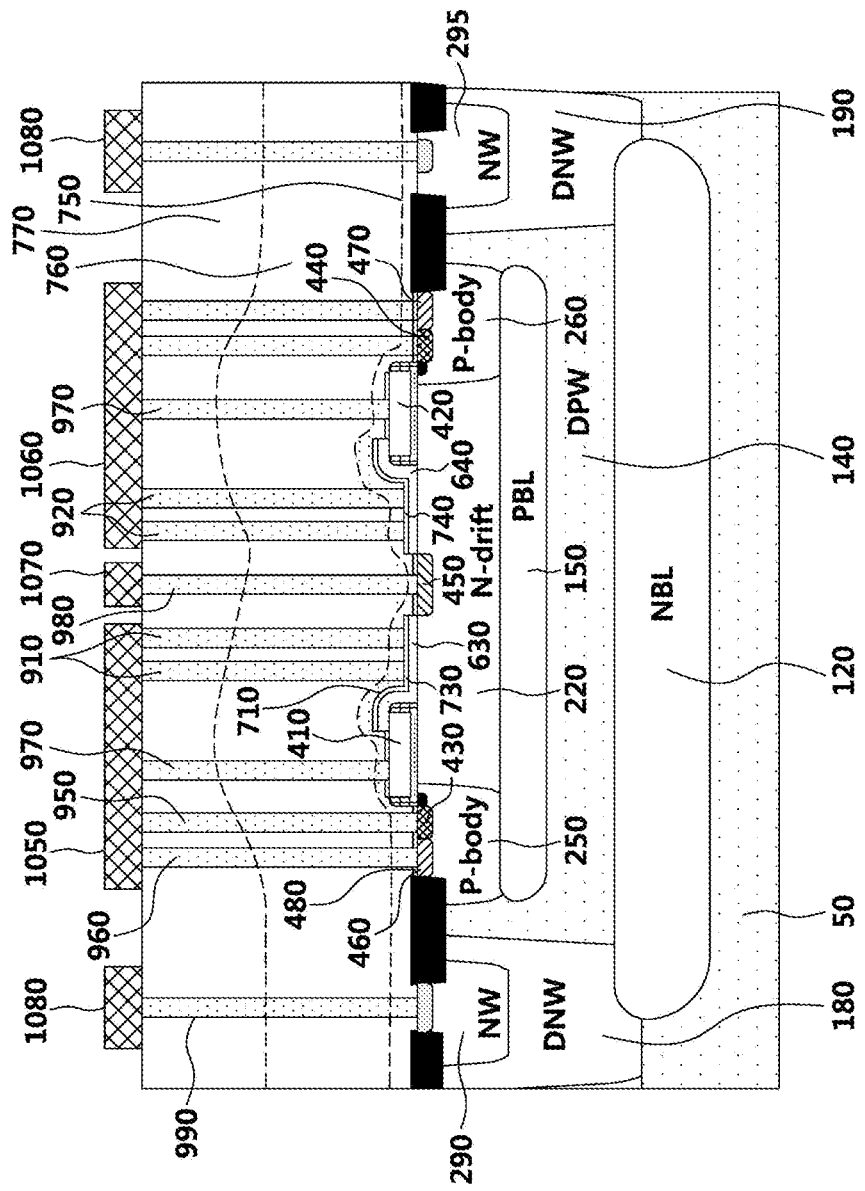

FIG. 14 and FIG. 15 are structures in which the field plate plugs 810, 820, 830, and 840 are formed in a semiconductor device of PLDMOS and NLDMOS, respectively, according to an example.

According to the example of FIG. 14, the first field plate plugs 810 and 820 may be formed on the non-silicide layers 610, 620, 710 and 720. According to the example of FIG. 15, the second field plate plugs 830 and 840 may be formed on the second non-silicide layers 630, 640, 730 and 740. The first and second field plate plugs 810, 820, 830, and 840 may be arranged to vertically overlap the non-silicide layers 610, 620, 630, 640, 710, 720, 730 and 740. However, the field plate plugs 810, 820, 830, and 840 may be disposed so as not to vertically overlap with the gate electrodes 310, 320, 410, and 420 in order to thereby optimize fabrication method or to thereby reduce fabrication defects. The field plate plugs 810, 820, 830, and 840 may be disposed to be adjacent to the drain regions 350 and 450 rather than the gate electrodes 310, 320, 410 and 420 which may increase the breakdown voltage of the semiconductor devices 10 and 20. Further, the field plate plugs 830 and 840 may be disposed to vertically overlap with the second conductivity type buried layer 150 in the NLDMOS device 20. The field plate plugs 810, 820, 830, and 840 may be made of polysilicon or a conductivity type material like metal such as tungsten (W), aluminum (Al), copper (Cu), as non-limiting examples, or a similar material.

According to the examples of FIG. 14 and FIG. 15, source contact plugs 850 and 950 may be formed to contact the source regions 330, 340, 430 and 440. Body contact plugs 860 and 960 may be formed to contact the body contact regions 360, 370, 460 and 470. Gate contact plugs 870 and 970 may be formed to contact the gate electrodes 310, 320, 410 and 420. Drain contact plugs 880 and 980 may be formed to contact the drain regions 350 and 450. In an example, the field plate plugs 810, 820, 830, and 840 may be simultaneously formed with respect to a time at which source contact plugs 850 and 950, gate contact plugs 870 and 970 and drain contact plugs 880 and 980 are formed.

The drain contact plugs 880 and 980 may be electrically connected to the drain regions 350, 450. The source contact plugs 850 and 950 may be electrically connected to the source regions 330, 340, 430, 440. The gate contact plugs 870 and 970 may be electrically connected to gate electrodes 310, 320, 410, 420.

According to the examples of FIG. 14 and FIG. 15, the field plate contact plugs 810, 820, 830, and 840 may be electrically connected with the source contact plugs 850 and 950 or the gate contact plugs 870 and 970. For example, the field plate plugs 810, 820, 830, and 840 may be electrically connected to the source contact plugs 850 and 950 through a metal wire 1010. Thus, the field plate plugs 810, 820, 830, 840 and the source contact plugs 850 and 950 may have the same electrical potential. In a similar manner, the field plate plugs 810, 820, 830, and 840 may be electrically connected to the body contact plugs 860 and 960 through a metal wire 1010. Furthermore, the field plate contact plugs 810, 820, 830, and 840 may be electrically connected with the gate contact plugs 870 and 970 through a metal wire 1010. As discussed in further detail, above, such connections help manage the electrical properties of these elements.

The field plate plugs 810, 820, 830, 840 may alleviate the electric field formed from high in the drain region. That is, the electric field may be distributed uniformly instead of being concentrated in only one location. Accordingly, by providing the field plate plugs 810, 820, 830, and 840, the breakdown voltages of the PLDMOS 10 and NLDMOS 20 devices may be increased as a result. In addition, by using the field plate plugs 810, 820, 830, and 840 structures, the RESURF structures, such as a field oxide and a trench type isolation region, may not be used between the gate electrode and the drain region. In addition, without such a field oxide film, a top surface of the substrate between the common P+ drain region 350 and 450 and the gate electrodes 310, 320, 410, and 420 may be a flat structure, such that a straight current path may be formed between the drain region and the source region, rather than a curved shape. In this example, in the ON state of the PLDMOS 10 and the NLDMOS 20, the ON resistance (Ron) may be reduced.

Through using this process, a high voltage semiconductor device provided with both a second conductivity type PLDMOS and a first conductivity type NLDMOS may be manufactured successfully. In the manufacturing of such a high voltage semiconductor device, by forming a body region and an LDD region before the gate processing, ion implantation of the dopant may be possible at the minimum angle to form a channel when the gate electrode is not formed. In addition, the body region and the LDD region may be formed using the same mask pattern, thereby reducing the number of masks required in the processing.

According to the manufacturing method of a high voltage semiconductor device, as described in further detail above, the processing order may be improved to form a body region and an LDD region by implanting a dopant at a predetermined tilt angle before forming a gate electrode. Therefore, it may be possible to secure a channel region while implanting a dopant at a desired point of the body region in a helpful manner.

In addition, by reducing the tilt angle as discussed in further detail, above, the size of the channel region may also be reduced, thereby reducing the size of the device to reduce on resistance characteristics (Rdson), and the size of the overall chip.

In addition, because only one mask pattern is used for the body region and the LDD region, the number of masks in the overall processing can be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
a substrate having a first area and a second area;

a first buried layer in the first area and a second buried layer in the second area;

a first drift region disposed on the first buried layer;

a first body region and a second body region disposed on the first buried layer to surround the first drift region;

a first gate electrode partially overlapping the first body region to form a first channel;

a second gate electrode partially overlapping the second body region to form a second channel;

a first source region disposed in the first body region and a second source region disposed in the second body region;

a first drain region disposed between the first gate electrode and the second gate electrode;

a first silicide layer disposed in the first area;

a first non-silicide layer disposed between the first gate electrode and the first drain region, the first non-silicide layer being insulative; and a first field plate disposed over the first non-silicide layer.

2. The semiconductor device of claim 1, further comprising:

a second non-silicide layer disposed between the first drain region and the second gate electrode; and a second field plate disposed over the second non-silicide layer.

3. The semiconductor device of claim 2, wherein the first field plate is electrically connected to the first source region, and the second field plate is electrically connected to the second source region.

4. The semiconductor device of claim 1, wherein the first and second non-silicide layers extend over the first and second gate electrodes, respectively.

5. The semiconductor device of claim 2, further comprising:

a second drift region disposed on the second buried layer;

a third body region and a fourth body region disposed on the second buried layer to surround the second drift region;

a third gate electrode partially overlapping the third body region to form a third channel;

a fourth gate electrode partially overlapping the fourth body region to form a fourth channel;

a third source region disposed in the third body region and a fourth source region disposed in the fourth body region;

a second drain region disposed between the third gate electrode and the fourth gate electrode;

a second silicide layer disposed in the second area;

a third non-silicide layer disposed between the third gate electrode and the third drain region, the third non-silicide layer being insulative; and a third field plate disposed over the third non-silicide layer.

6. The semiconductor device of claim 5, further comprising:

a fourth non-silicide layer disposed between the second drain region and the fourth gate electrode; and a fourth field plate disposed over the fourth non-silicide layer.

7. The semiconductor device of claim 6, wherein the third field plate is electrically connected to the third source region, and the fourth field plate is electrically connected to the fourth source region.

8. The semiconductor device of claim 6, wherein the third and fourth non-silicide layers extend over the third and fourth gate electrodes, respectively.

9. The semiconductor device of claim 1, wherein the first non-silicide layer has an area greater than an area of the first field plate in a plan view.

10. A semiconductor device, comprising:

a substrate having a first area and a second area;

a first buried layer in the first area and a second buried layer in the second area;

a third buried layer disposed on the second buried layer and having a conductivity type opposite to that of the second buried layer;

a drift region disposed on the third buried layer;

a body region comprising a first body region and a second body region spaced apart from the first body region and disposed on the third buried layer to surround the drift region;

a first source region disposed in the first body region;

a drain region disposed in the drift region;

a first gate electrode disposed between the first source region and the drain region;

a first non-silicide layer disposed between the first gate electrode and the drain region, the first non-silicide layer being insulative; and a first field plate disposed over the first non-silicide layer.

11. The semiconductor device of claim 10, further comprising:

a second source region disposed in the second body region;

a second gate electrode between the drain region and the second source region;

a second non-silicide layer located between the drain region and the second gate electrode; and a second field plate disposed over the second non-silicide layer.

12. The semiconductor device of claim 11, wherein the first field plate is electrically connected to the first source region, and the second field plate is electrically connected to the second source region.

13. The semiconductor device of claim 11, wherein the first and second non-silicide layers extend over the first and second gate electrodes, respectively.

14. The semiconductor device of claim 10, wherein the first non-silicide layer has an area greater than an area of the first field plate in a plan view.

15. The semiconductor device of claim 10, wherein the third buried layer is in direct contact with the drift region and the body region.

16. The semiconductor device of claim 15, wherein a length of the third buried layer is smaller than a length of the second buried layer.

17. The semiconductor device of claim 16, further comprising:

a guard ring surrounding the body region and connecting the second buried layer; and a deep well region disposed between the second buried layer and the third buried layer.

* * * * *